(12) United States Patent
Murozono et al.

(10) Patent No.: US 8,597,971 B2
(45) Date of Patent: Dec. 3, 2013

(54) METHOD FOR PRODUCING PHOTOVOLTAIC DEVICE AND PHOTOVOLTAIC DEVICE

(71) Applicant: Clean Venture 21 Corporation, Hirakata (JP)

(72) Inventors: Mikio Murozono, Osaka (JP); Takeshi Hibino, Nara (JP); Noboru Mouri, Osaka (JP); Young-tae Park, Osaka (JP); Toshiyuki Nakamura, Osaka (JP); Yoshiaki Kodani, Osaka (JP)

(73) Assignee: Clean Venture 21 Corporation, Osaka (JP)

( * ) Notice: Subject to any disclaimer, the term of this patent is extended or adjusted under 35 U.S.C. 154(b) by 0 days.

(21) Appl. No.: 13/687,928

(22) Filed: Nov. 28, 2012

(65) Prior Publication Data
US 2013/0164880 A1    Jun. 27, 2013

Related U.S. Application Data

(62) Division of application No. 11/351,114, filed on Feb. 10, 2006, now Pat. No. 8,338,690.

(30) Foreign Application Priority Data

Feb. 18, 2005  (JP) .................................. 2005-042001
Mar. 1, 2005   (JP) .................................. 2005-056495

(51) Int. Cl.
*H01L 31/18*    (2006.01)
(52) U.S. Cl.
USPC ........................................................ 438/72
(58) Field of Classification Search
None
See application file for complete search history.

(56) References Cited

U.S. PATENT DOCUMENTS

| 4,278,831 A | 7/1981 | Riemer et al. |
| 4,521,640 A | 6/1985 | Levine |

(Continued)

FOREIGN PATENT DOCUMENTS

| DE | 100 52 914 A1 | 5/2002 |
| EP | 1 102 332 A2 | 5/2001 |

(Continued)

OTHER PUBLICATIONS

Chinese Office Action issued in Chinese Patent Application No. CN 200610004704.1, mailed on Mar. 14, 2008.

(Continued)

*Primary Examiner* — Seahvosh Nikmanesh
(74) *Attorney, Agent, or Firm* — McDermott Will & Emery LLP

(57) ABSTRACT

A method for producing a photovoltaic device that includes spherical photovoltaic elements and a support with a large number of recesses for receiving the elements one by one and to the photovoltaic device. Each of the spherical photovoltaic elements includes a spherical first semiconductor and a second semiconductor layer covering the first semiconductor. A conductive adhesive is applied to the bottoms of the recesses of the support serving as a second conductor layer. The elements are disposed in the bottoms of the recesses with the conductive adhesive applied thereto, to fix the elements to the support and electrically connect their second semiconductor layers to the support. An electrical insulator layer, which has through-holes serving as conductive paths, is bonded to the backside of the support, and a first conductor layer, which interconnects the electrodes of the first semiconductors of the respective elements, is formed thereon.

13 Claims, 29 Drawing Sheets

(56) References Cited

U.S. PATENT DOCUMENTS

| | | |
|---|---|---|
| 4,581,103 A | 4/1986 | Levine et al. |
| 4,582,588 A | 4/1986 | Jensen et al. |
| 4,609,770 A | 9/1986 | Nishiura et al. |
| 5,468,304 A | 11/1995 | Hammerbacher |
| 2002/0033514 A1 | 3/2002 | Sugawara et al. |
| 2002/0036009 A1 | 3/2002 | Kyoda et al. |
| 2002/0096206 A1 | 7/2002 | Hamakawa et al. |
| 2004/0016456 A1 | 1/2004 | Murozono et al. |
| 2004/0140001 A1 | 7/2004 | Hammerbacher et al. |
| 2011/0232729 A1* | 9/2011 | Hosoya et al. ............ 136/252 |

FOREIGN PATENT DOCUMENTS

| | | |
|---|---|---|
| EP | 1 213 772 A2 | 6/2002 |
| JP | 61-124179 A | 6/1986 |
| JP | 2001-267609 A | 9/2001 |
| JP | 2002-050780 A | 2/2002 |
| JP | 2002-076395 A | 3/2002 |
| JP | 2004-063564 A | 2/2004 |
| WO | WO-02/37576 A2 | 5/2002 |

OTHER PUBLICATIONS

Takashi Minemoto, et al., "Fabrication of Spherical Silicon Solar Cells with Semi-Light-Concentration System," Japanese Journal of Applied Physics, 2005, pp. 4820-4824, vol. 44, No. 7A, XP-002386717, The Japan Society of Applied Physics.

Japanese Office Action issued in Japanese Patent Application No. JP 2005-056495 dated May 26, 2011.

* cited by examiner (1)

(2)

(1)

(2)

(3)

(1)

(2)

(1)

(2)

(3)

(4)

(5)

(1)

(2)

(1)

(2)

(1)

(2)

(3)

(1)

(2)

(3)

METHOD FOR PRODUCING PHOTOVOLTAIC DEVICE AND PHOTOVOLTAIC DEVICE

RELATED APPLICATIONS

This application is a Divisional of U.S. patent application Ser. No. 11/351,114, filed on Feb. 10, 2006, which in turn claims the benefit of Japanese Application No. 2005-042001 filed on Feb. 18, 2005 and Japanese Patent Application No. 2005-056495 filed on Mar. 1, 2005, the disclosures of which Applications are incorporated by reference herein.

FIELD OF THE INVENTION

The present invention relates to a method for producing a photovoltaic device including spherical photovoltaic elements and to the photovoltaic device.

BACKGROUND OF THE INVENTION

Photovoltaic devices have been receiving attention as a clean energy source. There are two types of representative photovoltaic devices: those using an element made of a crystal silicon semiconductor wafer; and those using a semiconductor layer made of amorphous silicon. The former requires complicated steps to produce a single-crystal ingot and work the single-crystal ingot into semiconductor wafers. Further, its production cost is high, since the utilization rate of expensive silicon raw material is low due to the crystal waste produced in the cutting step or the like. In the latter, when the amorphous structure, in which hydrogen is combined to the dangling bond of silicon, is exposed to light, the hydrogen is released and a structural change tends to occur. Hence, the latter device has a problem in that the photovoltaic efficiency lowers gradually due to exposure to light.

In order to provide a photovoltaic device that is free from such degradation of characteristics, inexpensive, and expected to provide a high output, there have been examined spherical solar cells using a spherical photovoltaic element that is composed of a spherical p-type semiconductor (first semiconductor) and an n-type semiconductor layer (second semiconductor layer) formed on the surface of the spherical p-type semiconductor. One such example is a solar array as proposed in U.S. Pat. No. 4,581,103, in which spherical silicon (Si) elements are embedded in the apertures of a flat aluminum (Al) foil, their n-type semiconductor layers are etched from the backside of the aluminum foil to expose the interior p-type semiconductors, and the exposed p-type semiconductors are connected to another aluminum foil.

This proposal utilizes small elements with a diameter of around 1 mm, thereby decreasing the average thickness of the whole photovoltaic section and reducing the amount of high-purity Si. However, since this spherical solar cell is of the type not utilizing reflected light, its output per element is low. Thus, in order to improve the conversion efficiency per light-receiving surface of the module, it is necessary to arrange a large number of elements densely such that they are close to one another. Hence, the process for connecting the elements to the aluminum foil becomes complicated and, moreover, a large number of elements are necessary. As a result, a large cost reduction is not possible.

Also, in order to bond the Si semiconductors to the aluminum foil conductor layer and obtain a good electrical connection therebetween, the above proposal includes the step of applying a heat treatment at 500 to 577° C. to form an alloy layer of aluminum and Si at the joint therebetween. However, such a heat treatment causes a short-circuit phenomenon since the second semiconductor layer is a thin layer with a thickness of 0.5 μm or less and the conductor layer pierces the thin second semiconductor layer upon the heat treatment. Therefore, there are drawbacks of large deteriorations in open-circuit voltage, fill factor, and the like.

In order to solve these problems, there has been proposed a solar cell that is composed of a support with a large number of recesses and spherical photovoltaic elements with a diameter of around 1 mm disposed in the recesses, wherein the inner faces of the recesses are utilized as reflecting mirrors (e.g., Japanese Laid-Open Patent Publication No. 2002-50780, US 2002/0096206 A1, and US 2004/0016456 A1). Such a solar cell is called a micro concentrator-type or low concentrator-type spherical solar cell. A first advantage of this configuration is a reduction in the amount of element materials, particularly, expensive Si. A second advantage is effective utilization of light; due to the action of the reflecting mirror, light that is 4 to 6 times as much as the light directly incident on the element can be allowed to enter the element.

As a representative conventional method for producing photovoltaic devices of this type, the proposal previously made by the present inventors (US 2004/0016456 A1) is described below. A photovoltaic element comprises a spherical first semiconductor and a second semiconductor layer covering the surface thereof, and a part of the first semiconductor is exposed from the second semiconductor layer. An electrode is previously formed on the exposed part of the first semiconductor and the second semiconductor layer. A support has a plurality of recesses for receiving such elements and comprises a second conductor layer to be electrically connected to the second semiconductor layers and an electrical insulator layer formed on the backside of the second conductor layer. On the backside of the electrical insulator layer is formed a first conductor layer that electrically interconnects the electrodes of the first semiconductors.

According to such a configuration, electrode formation requiring a high-temperature heat treatment is done before the elements are disposed in the support. Hence, there is an advantage in that the electrodes and the conductor layer can be connected at a relatively low temperature after the elements are disposed in the support. However, since the electrode for the second semiconductor layer is formed on a curved surface near the opening of the second semiconductor layer, such electrode formation requires accurate positioning and a technique for forming a fine shape, thus being unsuitable for mass-production.

Also, this support has a two-layer structure consisting of the second conductor layer with the recesses for receiving the elements and the electrical insulator layer. Such a support can be produced, for example, by integrally laminating a second conductor layer, which is obtained by working a metal sheet to form a plurality of recesses, each recess having an aperture in the bottom, and an electrical insulator sheet with through-holes corresponding to the apertures. However, in actuality, in the process of integrating these two sheets by adhesion or thermo-compression bonding, the electrical insulator sheet made of resin may be deformed, thereby causing changes in the pitch, dimensions, and shape of the through-holes and hence displacement. It is therefore difficult to produce such a support with good accuracy. The three-layer support as disclosed, for example, in US 2002/0096206 A1 also has the same problem as the above-mentioned two-layer support.

Further, in spherical solar cells, it is extremely Important to mount all of the large number of very small spherical elements in predetermined positions inside the small recesses accurately and promptly. If the positioning of the elements is inaccurate or dislocation occurs during the production process or operation of the spherical solar cell, the second conductor layer comes into contact with the exposed part or electrode of the first semiconductor to cause a short-circuit, or an electrical connection cannot be formed between the semiconductor and the conductor layer. In the event of separation of the elements, the output of the photovoltaic device lowers.

In order to solve these problems, for example, US 2004/0016456 A1 discloses a method of positioning elements, with a conductive paste applied to the electrodes of their second semiconductors, inside the recesses of the support, and then heating the elements to fix them to the support. However, this method has following problems. For example, it is difficult to apply the conductive paste to the minute electrodes at a high speed. Also, in the process of positioning the elements in the support, the conductive paste applied to the elements adheres to the reflecting mirrors of the recesses, thereby lowering the photovoltaic efficiency.

BRIEF SUMMARY OF THE INVENTION

The present invention solves the above-noted problems associated with the spherical solar cell that is composed of a support with a large number of recesses and spherical photovoltaic elements disposed in the respective recesses. An object of the present invention is to provide a method for effectively producing a photovoltaic device with high quality and high reliability, by fixing the elements to predetermined positions inside the respective recesses in a reliable manner and electrically connecting the semiconductors of the elements to the conductor layer at a low resistance. Another object of the present invention is to provide such a photovoltaic device with high quality and high reliability.

The present invention provides a method of producing a photovoltaic device including a plurality of substantially spherical photovoltaic elements, a support, an electrical insulator layer, and a first conductor layer.

Each of the substantially spherical photovoltaic elements includes: a spherical first semiconductor; a second semiconductor layer covering the surface of the first semiconductor, the second semiconductor layer having an opening through which a part of the first semiconductor is exposed; and an electrode formed on the exposed part of the first semiconductor.

The support has a plurality of adjacent recesses for receiving the photovoltaic elements one by one on a frontside thereof, each of the recesses having an aperture in a bottom thereof, the aperture being smaller than each of the photovoltaic elements. The support serves as a second conductor layer that is electrically connected to the second semiconductor layers of the respective photovoltaic elements disposed in the recesses.

Each of the photovoltaic elements is fixed to each of the recesses with a conductive adhesive such that the second semiconductor layer thereof is in contact with an edge of the aperture of the recess and that the exposed part of the first semiconductor protrudes through a backside of the support.

The electrical insulator layer and the first conductor layer are provided on the backside of the support such that the electrical insulator layer insulates the support from the first conductor layer. The electrical insulator layer has a plurality of through-holes, and the first conductor layer is electrically connected to the electrodes of the photovoltaic elements via the through-holes of the electrical insulator layer.

This production method of the present invention includes the steps of:

(a) providing a plurality of substantially spherical photovoltaic elements A1, each comprising a spherical first semiconductor and a second semiconductor layer covering the whole surface of the first semiconductor;

(b) forming an opening in the second semiconductor layer of each of the photovoltaic elements A1 to expose a part of the first semiconductor, to prepare photovoltaic elements A2;

(c) forming an electrode on the exposed part of the first semiconductor of each of the photovoltaic elements A2, to prepare photovoltaic elements A3;

(d) providing the support;

(e) applying a conductive adhesive to a periphery of each of the apertures of the support;

(f) disposing the photovoltaic elements A1, A2 or A3 in the recesses of the support such that the second semiconductor layers are in contact with the edges of the apertures of the support, and connecting the second semiconductor layers to the support electrically and physically with the conductive adhesive;

(g) forming an electrical insulator layer on the backside of the support;

(h) forming through-holes in the electrical insulator layer, the through-holes serving as conductive paths for interconnecting the electrodes of the photovoltaic elements A3; and (i) forming a first conductor layer on the electrical insulator layer, the first conductor layer electrically interconnecting the electrodes that are exposed inside the through-holes.

In a first preferable embodiment of the production method of the present invention, the steps (a) and (d) are performed, and then the steps (e), (f), (b), (g), (h), (c), and (i) are performed in this order. In a second preferable embodiment, the steps (a) and (d) are performed, and then the steps (e), (f), (b), (c), (g), (h), and (i) are performed in this order. Further, in a third preferable embodiment, the steps (a) and (d) are performed, and then the steps (e), (f), (g), (h), (b), (c), and (i) are performed in this order.

In the first to third embodiments, first, the step (a) is performed to prepare a plurality of photovoltaic elements A1 each comprising a spherical first semiconductor and a second semiconductor layer covering the whole surface thereof, while the step (d) is performed to prepare a support serving as a second conductor layer. Subsequently, the step (e) is performed to apply a conductive adhesive to the periphery of each of the apertures of the support. In the next step (f), each of the photovoltaic elements A1 is disposed in each recess of the support such that the second semiconductor layer thereof is in contact with the edge of the aperture, whereby the second semiconductor layer adheres to the edge of the aperture with the conductive adhesive, and further, the support is heated to solidify the conductive adhesive. These steps produces a structure B1 in which the photovoltaic elements A1 are fixed to the predetermined positions of the support such that their second semiconductor layers are electrically connected to the second conductor layer.

In the first embodiment, after the steps (a), (d), (e), and (f), the step (b) is performed. That is, at least a part of the second semiconductor layer of each photovoltaic element A1 on the backside of the support of the structure B1 is removed to expose the first semiconductor. As a result, the photovoltaic elements A1 are converted to photovoltaic elements A2. Subsequently, the step (g) is performed to form an electrical insulator layer on the backside of the support, and the step (h) is then performed to form through-holes in the electrical insulator layer such that at least a part of the exposed part of the first semiconductor of each photovoltaic element A2 is exposed. Next, the step (c) is performed to form an electrode on the exposed surface of the first semiconductor inside each through-hole. As a result, the photovoltaic elements A2 are converted to photovoltaic elements A3. In the last step (i), a first conductor layer is formed. The first conductor layer electrically interconnects the electrodes of the photovoltaic elements A3 that are exposed inside the through-holes of the electrical insulator layer, with the through-holes serving as conductive paths.

In the second embodiment, in the same manner as in the first embodiment, after the steps (a), (d), (e), and (f), the step (b) is performed to expose at least a part of the first semiconductor on the backside of the support of the structure B1. As a result, the photovoltaic elements A1 are converted to photovoltaic elements A2. Next, the step (c) is performed to form an electrode on the exposed surface of the first semiconductor. As a result, the photovoltaic elements A2 are converted to photovoltaic elements A3. Subsequently, the step (g) is performed to form an electrical insulator layer on the backside of the support, and the step (h) is then performed to form through-holes in the electrical insulator layer such that the electrodes of the photovoltaic elements A3 are exposed. In the last step (i), a first conductor layer is formed in the same manner as in the first embodiment.

In the third embodiment, after the steps (a), (d), (e), and (f), the step (g) is performed to form an electrical insulator layer on the backside of the support of the structure B1, and the step (h) is then performed to form through-holes in the electrical insulator layer such that a part of the second semiconductor layer of each photovoltaic element A1 is exposed. Subsequently, the step (b) is performed to remove the part of the second semiconductor layer exposed inside each through-hole of the electrical insulator layer such that the first semiconductor is exposed. As a result, the photovoltaic elements A1 are converted to photovoltaic elements A2. Thereafter, the step (c) is performed to form an electrode on the exposed surface of the first semiconductor of each photovoltaic element A2. As a result, the photovoltaic elements A2 are converted to photovoltaic elements A3. In the last step (i), a first conductor layer is formed in the same manner as in the first embodiment.

In a fourth preferable embodiment of the production method of the present invention, the steps (a), (b), (c), and (d) are performed, and then the steps (e), (f), (g), (h), and (i) are performed in this order. In the fourth embodiment, first, the step (a) is performed to prepare photovoltaic elements A1, and the step (b) is then performed to remove a part of the second semiconductor layer of each photovoltaic element A1 to expose a part of the first semiconductor. As a result, photovoltaic elements A2 are obtained. Subsequently, the step (c) is performed to form an electrode on the exposed surfaces of the first semiconductors of the photovoltaic elements A2, to prepare photovoltaic elements A3. Meanwhile, the step (d) is performed to prepare a support in the same manner as in Embodiment 1. Subsequently, the step (e) is performed to apply a conductive adhesive to the periphery of each aperture of the support. Thereafter, in the step (f), each of the photovoltaic elements A3 is disposed in each recess of the support such that the second semiconductor layer thereof is in contact with the edge of the aperture, and the support is heated to solidify the conductive adhesive. These steps produces a structure B2 in which the photovoltaic elements A3 with the electrodes are fixed to the predetermined positions of the support such that their second semiconductor layers are electrically connected to the second conductor layer.

Thereafter, the step (g) is performed to form an electrical insulator layer on the backside of the support of the structure B2, and the step (h) is then performed to form through-holes in the electrical insulator layer such that the electrodes of the photovoltaic elements A3 are exposed. In the last step (i), a first conductor layer is formed in the same manner as in the first embodiment.

In a fifth preferable embodiment of the production method of the present invention, the steps (a), (b), and (d) are performed, and then the steps (e), (f), (g), (h), (c), and (i) are performed in this order. In the fifth embodiment, first, the step (a) is performed to prepare photovoltaic elements A1. Then, the step (b) is performed to remove a part of the second semiconductor layer in order to expose a part of the first semiconductor. As a result, photovoltaic elements A2 are obtained. Meanwhile, the step (d) is performed to prepare a support serving as a second conductor layer. Subsequently, the step (e) is performed to apply a conductive adhesive to the periphery of each aperture of the support. In the next step (f), each of the photovoltaic elements A2 is disposed in each recess of the support such that the second semiconductor layer is in contact with the edge of the aperture, and the support is heated to solidify the conductive adhesive. These steps produces a structure B3 in which the photovoltaic elements A2, each having the exposed part of the first semiconductor, are fixed to the predetermined positions of the support such that their second semiconductor layers are electrically connected to the second conductor layer.

Thereafter, the step (g) is performed to form an electrical insulator layer on the backside of the support of the structure B3, and the step (h) is then performed to form through-holes in the electrical insulator layer such that the first semiconductor of each photovoltaic element A2 is exposed inside each through-hole. Next, the step (c) is performed to form an electrode on the exposed surface of the first semiconductor inside the through-hole of the electrical insulator layer. As a result, the photovoltaic elements A2 are converted to photovoltaic elements A3. In the last step (i), a first conductor layer is formed in the same manner as in the first embodiment.

It is preferred that the photovoltaic elements of the present invention be composed mainly of silicon.

It is preferred that the step (a) further include the step of forming a conductive anti-reflection coating on the surface of each of the second semiconductor layers, and that a part of the anti-reflection coating be removed together with the second semiconductor layer in the step (b) to form the opening. The anti-reflection coating preferably comprises tin oxide doped with at least one of fluorine and antimony and has a thickness of 50 to 100 nm.

The step (e) preferably includes the steps of:

applying the conductive adhesive onto tips of pins that are slightly larger than the apertures of the support; and transferring the conductive adhesive applied to the tips onto the peripheries of the apertures, by inserting the tips into the recesses of the support from the frontside of the support and bringing the tips into contact with the peripheries of the apertures such that the centers of the tips and the apertures align.

The step (e) preferably includes the steps of:

setting a metal mask on the backside of the support, the metal mask having a plurality of opening groups corresponding to the apertures of the support, each opening group consisting of a plurality of openings that are arranged along an opening edge of each aperture, each opening being shaped so as to cover an area extending from an outer part of the opening edge of the aperture to an inner part thereof; and printing the conductive adhesive on the support through the openings of the metal mask, such that the conductive adhesive is applied to the support at a plurality of locations along the opening edge of each of the apertures so as to cover an area extending from a periphery of each aperture on the backside of the support to a periphery of the aperture on the frontside thereof.

The step (b) preferably includes removing a part of the second semiconductor layer of each of the photovoltaic elements A1 by etching, to form the opening. The step (b) preferably includes, prior to the etching step, the step of preliminarily removing the part of the second semiconductor layer to be etched by brushing or sandblasting.

In the fourth embodiment, the step (b) preferably includes the step of cutting a part of each of the photovoltaic elements A1 such that the opening of the second semiconductor layer thereof is substantially flush with the exposed part of the first semiconductor.

The step (c) preferably includes the steps of:
applying a conductive paste to the exposed part of the first semiconductor of each of the photovoltaic elements A2; and
applying a heat treatment to the applied conductive paste by laser irradiation, to form the electrode.

In the fourth embodiment, the step (b) preferably includes the steps of:
providing a supporting member that has a plurality of recesses in a predetermined pattern for receiving the photovoltaic elements A1 in a predetermined depth;
disposing the photovoltaic elements A1 in the recesses of the supporting member;
applying a molten wax to the supporting member and cooling it, to fix the photovoltaic elements A1 to the recesses of the supporting member with the solidified wax; and
pressing a rotary grinder onto the photovoltaic elements A1 fixed to the supporting member to grind the surfaces of the photovoltaic elements A1, in order to form the exposed parts of the first semiconductors, and the step (c) preferably includes the steps of:
applying a conductive paste to the exposed parts of the first semiconductors; and
heating the supporting member to a temperature of 400 to 800° C., to remove the wax and form the electrodes on the exposed parts of the first semiconductors.

In the fourth embodiment, each of the photovoltaic elements A3 is preferably configured such that the electrode or a vicinity thereof is more magnetic than other parts, and the step (f) preferably includes the step of applying a magnetic field to the photovoltaic elements A3 from a predetermined direction, to align the electrodes or vicinities thereof in a predetermined orientation.

The step (g) preferably includes the step of bonding a semicured electrical insulator layer, which comprises an insulating sheet composed mainly of a thermosetting resin, to the backside of the support under pressure. The step (i) preferably includes the steps of:
bonding a conductive metal sheet to the semicured electrical insulator layer under pressure; and
setting the semicured electrical insulator layer by a heat treatment, to fix the conductive metal sheet to the electrical insulator layer.

The step (i) preferably includes the step of applying a conductive paste to the electrical insulator layer so as to interconnect the electrodes of the photovoltaic elements A3 that are exposed inside the through-holes of the electrical insulator layer and heating it for solidification, to form the first conductor layer.

The step (i) preferably includes the steps of:
filling a conductive paste into the through-holes of the electrical insulator layer so as to come into contact with the electrodes of the photovoltaic elements A3;
bonding a conductive metal sheet to the electrical insulator layer; and
heating and solidifying the conductive paste, to electrically connect the conductive paste to the conductive metal sheet.

In the second and forth embodiments, the steps (g) to (i) preferably include the steps of:
bonding an electrical insulator layer and a conductive metal sheet to the backside of the support such that the electrical insulator layer separates the conductive metal sheet from the support;
forming through-holes in the electrical insulator layer and the conductive metal sheet bonded to the support to expose the electrodes of the photovoltaic elements A3 inside the through-holes; and
filling a conductive paste into the through-holes to electrically connect the electrodes to the conductive metal sheet, in order to form the first conductor layer.

In the second and forth embodiments, the step of bonding the electrical insulator layer and the conductive metal sheet to the backside of the support preferably includes the step of bonding a composite sheet, which includes a conductive metal sheet and an electrical insulator layer laminated to one side of the conductive metal sheet, to the backside of the support such that the electrical insulator layer faces the support.

In the second and forth embodiments, the step of bonding the composite sheet comprises the steps of:
applying an electrically insulating adhesive to the backside of the support, to form an adhesive layer; and
bonding the electrical insulator layer of the composite sheet to the adhesive layer of the support.

A photovoltaic device in accordance with the present invention includes a plurality of substantially spherical photovoltaic elements, a support, an electrical insulator layer and a first conductor layer.

Each of the substantially spherical photovoltaic elements includes: a spherical first semiconductor; a second semiconductor layer covering the surface of the first semiconductor; a conductive anti-reflection coating covering the surface of the second semiconductor layer, the anti-reflection coating and the second semiconductor layer having an opening in common through which a part of the first semiconductor is exposed; and an electrode formed on the exposed part of the first semiconductor.

The support has a plurality of adjacent recesses for receiving the photovoltaic elements one by one on a frontside thereof, each of the recesses having an aperture in a bottom thereof, the aperture being smaller than each of the photovoltaic elements. The support serves as a second conductor layer that is electrically connected to the second semiconductor layers of the respective photovoltaic elements disposed in the recesses, with the anti-reflection coating interposed therebetween.

Each of the photovoltaic elements is fixed to each of the recesses with a conductive adhesive such that the anti-reflection coating thereof is in contact with an edge of the aperture of the recess and that the exposed part of the first semiconductor protrudes through a backside of the support.

The electrical insulator layer and the first conductor layer are provided on the backside of the support such that the electrical insulator layer insulates the support from the first conductor layer. The electrical insulator layer has a plurality of through-holes, and the first conductor layer is electrically connected to the electrodes of the photovoltaic elements via the through-holes of the electrical insulator layer.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
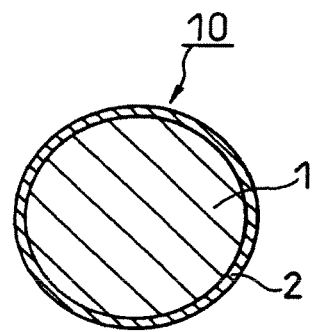
FIG. 1 is a longitudinal sectional view of a photovoltaic element A1 prepared in step (a) of the present invention.

The present invention has been completed particularly by solving the above-noted problems associated with the production method according to the invention of the present inventors as disclosed in US 2004/0016456 A1. The present invention has made it possible to efficiently produce a spherical solar cell with high quality and high reliability.

A first characteristic of the production method according to the present invention is that prior to mounting the photovoltaic elements A1, A2, or A3 in the predetermined positions of the support, a conductive adhesive is applied in advance to the periphery of the aperture in each recess of the support. The conductive adhesive serves to fix each element to the predetermined position of the support and electrically connect the second semiconductor layer to the second conductor layer.

According to a conventional method, for example, a conductive adhesive is applied in advance to the electrode formed on the outer surface of the second semiconductor layer of an element, and this element is then positioned and mounted in the recess of a support. As described above, this method has a problem in that when the element is mounted in the support, the conductive adhesive applied to the electrode tends to adhere to the inner face of the recess, thereby impairing the function of the inner face of the recess as the reflecting mirror. Another problem is that the fixation of the element to the support and the electrical connection on the second semiconductor layer side are unreliable. Further, there is also a drawback in productivity since the step of applying the conductive adhesive to the minute electrode is difficult.

On the other hand, according to the present invention, when the element is mounted in the support, the conductive adhesive does not adhere to the inner face of the recess. Thus, the fixation of the element and the electrical connection on the second semiconductor layer side can be achieved reliably without impairing the function as the reflecting mirror. Further, the conductive adhesive can be applied to the support at a high speed by printing, transfer, and the like.

A second characteristic of the production method according to the present invention is the use of the support separated from the electrical insulator layer, instead of the conventional two-layer support consisting of the second conductor layer and the electrical insulator layer that are integrally joined or the conventional three-layer support further comprising the first conductor layer. This support has a plurality of recesses, each recess being designed to receive a photovoltaic element, and the inner face of the recess functions as the reflecting mirror. At least the surface of the support on the light-receiving side is conductive and functions as the second conductor layer.

Further, a third characteristic of the production method according to the present invention relates to the second characteristic. That is, after the electrical insulator layer is formed on the backside of the support with the photovoltaic elements A1, A2, or A3 mounted therein, through-holes are formed in the electrical insulator layer in order to provide conductive paths electrically interconnecting the electrodes of the first semiconductors.

A first advantage derived from the second and third characteristics of the present invention is that the electrical insulator layer, comprising resin, is free from damage such as thermal deformation by the heat treatment that is applied to solidify the conductive adhesive for fixing the elements to the support, because the support is separated from the electrical insulator layer. This solves the conventional problem of deformation of the conductive paths previously formed in the electrical insulator layer, which causes dislocation of the elements disposed in the recesses of the support and hence an internal short-circuit or poor electrical connection.

A second advantage is that the support of the present invention, which usually has a one-layer metal structure, can be obtained with high accuracy by working a thin metal plate by pressing, cutting, or the like. In the case of the conventional support with the two-layer or three-layer structure, a highly accurate support cannot be obtained, because of the heat deformation of the electrical insulator layer during the production of the support and the errors which may occur in laminating the layers. It is thus difficult to mount elements in the predetermined positions.

A third advantage is that the dislocation or heat deformation of the conductive paths in the electrical insulator layer can be prevented. According to the present invention, the electrical insulator layer is formed on the backside of the support with the elements mounted therein and the through-holes are formed therein in a predetermined pattern. Thus, the conductive paths formed in such a manner are free from dislocation. In addition, since the electrical insulator layer is not overheated, the conductive paths are free from deformation.

Also, in the present invention, it is not always necessary to form an electrode for the second semiconductor previously. This is because unlike the first semiconductor, the second semiconductor layer has a low resistance since it contains a high concentration of an impurity diffused therein. The present inventors have experimentally found that the second semiconductor layer and the second conductor layer can be electrically connected at a low resistance without forming an electrode for the second semiconductor, by applying a conductive paste containing, for example, a thermosetting resin or a low melting-point glass frit as a binder therebetween and subjecting it to a heat treatment at approximately 100 to 500° C. Accordingly, it has become possible to electrically connect the second semiconductor layer to the second conductor layer without forming an electrode for the second semiconductor layer by directly bonding the second semiconductor layer of each element disposed in the support to the inner face (second conductor layer) of the recess of the support with a conductive adhesive and applying a heat treatment thereto. Since this heat treatment can be performed at a relatively low temperature, it does not damage the support composed mainly of metal such as aluminum.

Hereinafter, the first to fifth preferable embodiments of the method for producing a photovoltaic device according to the present invention are specifically described step by step.

Embodiment 1

This embodiment is directed to a production method in which steps (a) and (d) are performed, and then steps (e), (f), (b), (g), (h), (c), and (i) are performed in this order.

1-1) Step (a)

In this step, a plurality of photovoltaic elements A1, each comprising a spherical first semiconductor and a second semiconductor layer covering the whole surface thereof, are prepared.

The first semiconductor can be produced, for example, by supplying lumps of p-type polycrystalline Si containing a trace amount of boron into a crucible, melting it in an inert gas atmosphere, dropping the melt from a minute nozzle hole in the bottom of the crucible, and cooling the dropping droplets for solidification. The resulting spherical first semiconductor is a p-type polycrystalline or monocrystalline semiconductor. Usually, its surface is abraded, and the surface layer of approximately 50 μm is removed by etching or the like before it is used as the spherical first semiconductor.

The p-type first semiconductor is subjected to a heat treatment at 800 to 950° C. for 10 to 30 minutes, using, for example, phosphorus oxychloride as a diffusion source, whereby a phosphorus diffusion layer with a thickness of approximately 0.5 μm is formed on the surface of the p-type first semiconductor as the second semiconductor layer, i.e., n-type semiconductor layer. The n-type semiconductor layer can also be formed by CVD using a mixed gas, such as silane containing phosphine.

Although the element A1 as described above is configured such that the first semiconductor is a p-type semiconductor and the second semiconductor layer is an n-type semiconductor layer, the element A1 may be configured such that the first semiconductor is an n-type semiconductor and the second semiconductor layer is a p-type semiconductor layer. The first semiconductor may be composed of a core material whose outer surface is covered with a first semiconductor layer. Alternatively, the first semiconductor may be hollow around the center thereof. While it is preferred that the first semiconductor be completely spherical, it may be substantially spherical. The diameter of the first semiconductor is 0.5 to 2 mm, preferably 0.8 to 1.2 mm.

Figure 2:
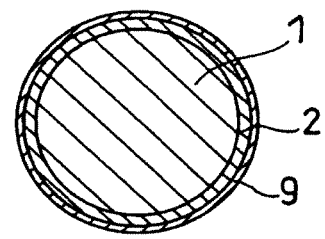
FIG. 2 is a longitudinal sectional view of a photovoltaic element A1 with an anti-reflection coating on the surface, which is prepared in step (a) of the present invention.

FIG. 1 illustrates an element in which an n-type semiconductor layer or p-type semiconductor layer is formed on the surface of a first semiconductor 1 as a second semiconductor layer 2. FIG. 2 illustrates an element further having an anti-reflection coating 9 on the second semiconductor layer 2. In the present invention, both elements as illustrated in FIGS. 1 and 2 are encompassed by the element A1.

In the case of the element A1 with the anti-reflection coating formed on the second semiconductor layer, the second semiconductor layer is electrically connected to a support (second conductor layer) with the anti-reflection coating interposed therebetween, in the step (f) that will be described later. Therefore, the anti-reflection coating of the present invention is preferably conductive. For example, it is possible to use a thin film composed mainly of ZnO, $SnO_2$, ITO ($In_2O_3$—Sn), or the like that is prepared by precipitation, atomization, spraying, or the like.

In terms of conductivity and index of refraction, it is particularly preferred that the anti-reflection coating comprise a tin oxide ($SnO_2$) coating doped with at least one of fluorine (F) and antimony (Sb) and have a thickness of 50 to 100 nm. For example, a $SnO_2$ coating with an almost uniform thickness is formed on the surfaces of a large number of elements with a second semiconductor layer formed thereon, by spraying fine particles of a solution with a doping material and a tin compound dissolved therein onto the elements while heating the elements on a heating plate at 400 to 600° C. and rotating them. The $SnO_2$ coating formed on the element surface is doped with at least one of F and Sb as a result of thermal decomposition of the fine particles of the solution on or near the element surface. Exemplary doping materials that may be used include ammonium fluoride, hydrofluoric acid, antimony pentachloride and antimony trichloride, and exemplary tin compounds that may be used include tin tetrachloride, dimethyltin dichloride and trimethyltin chloride.

Since the $SnO_2$ coating is highly conductive, its use as the transparent conductive film of a photovoltaic device utilizing a flat-plate like photovoltaic element has been examined. However, since such coating has a relatively large thickness of 400 to 1000 nm, it exhibits a very high reflectivity of approximately 12.3% when it is formed on the surface of a Si semiconductor. Therefore, it cannot fully function as the anti-reflection coating.

Although the element A1 as described in the foregoing embodiment comprises a crystalline Si semiconductor, it may comprise a compound semiconductor or the like. It may also comprise an amorphous material, in addition to single-crystal and polycrystal. Also, the element A1 may have a structure such as a pin-type having a non-doped layer at the interface between the first semiconductor and the second semiconductor layer, an MIS type, a Schottky barrier type, a homo-junction-type, or a hetero-junction-type.

1-2) Step (d)

In this step, a support is prepared. The support has a large number of recesses for receiving the photovoltaic elements and also serves as a second conductor layer that is electrically connected to the second semiconductor layers of the elements. Hence, the support needs to be conductive at least on the light receiving side.

Figure 3:
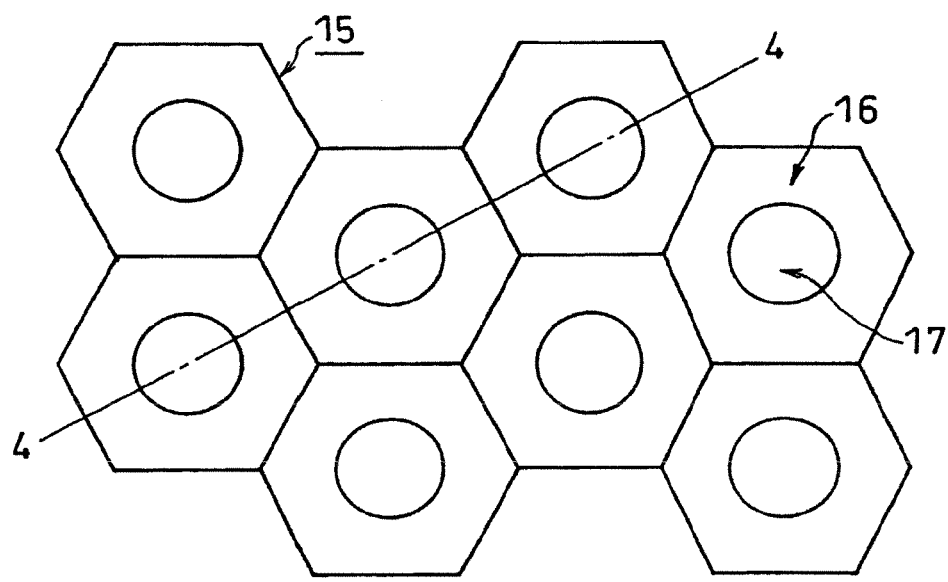
FIG. 3 is a plan view of a support in a first mode, which is prepared in step (d) of the present invention.
Figure 4:
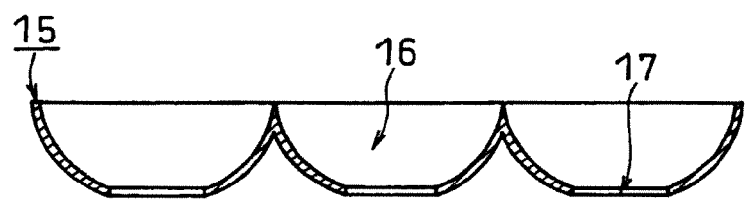
FIG. 4 is a cross-sectional view of the support of FIG. 3 taken along line 4-4 thereof.

FIG. 3 is a plan view showing a part of an exemplary support that is prepared by pressing an aluminum thin plate with a thickness of 0.2 mm, and FIG. 4 is a cross-sectional view taken along the line 4-4 of FIG. 3. A support 15 has recesses 16 that are shaped like a honeycomb, and their opening edges are hexagonal and adjacent to one another. Each of the recesses 16 narrows toward the bottom and has an aperture 17 in the bottom. The aperture 17 is smaller than the outer diameter of each element.

If the support has poor heat resistance, it is apt to deform or deteriorate in the heat treatment step performed to fix the elements to the support. It is therefore preferred to use a support comprising a heat resistant material such as metal. The main material of the support is preferably aluminum in view of processibility, conductivity, flexibility and costs, but it may be a conductive material such as copper, stainless steel, or nickel. If a layer of a highly conductive and reflective material, such as silver (Ag), is formed on the inner face of each recess of the support by plating, sputtering, vacuum deposition, or the like, the functions of the support as the second conductor layer and the reflecting mirror increase.

Figure 5:
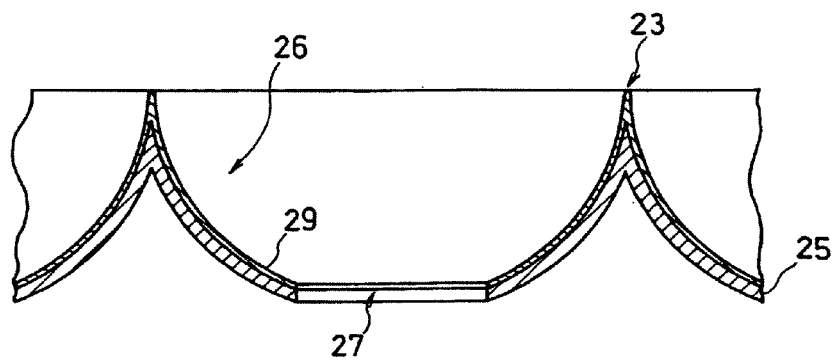
FIG. 5 is a longitudinal sectional view of a support in a second mode, which is prepared in step (d) of the present invention.
Figure 6:
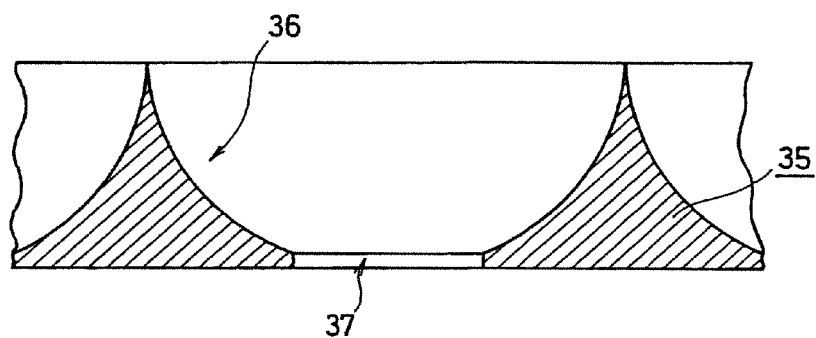
FIG. 6 is a longitudinal sectional view of a support in a third mode, which is prepared in step (d) of the present invention.

In addition to the support of FIG. 3, it is also possible to use various supports as illustrated in FIGS. 5 and 6. FIG. 5 shows a support comprising an aluminum or stainless steel substrate 25 that has a large number of recesses 26, each recess having an aperture 27 in the bottom, formed by press work or the like, with a reflecting mirror layer 29, made of, for example, Ag, on the inner faces of the recesses 26. The reflecting mirror layer 29 serves to significantly increase the output of the photovoltaic device.

FIG. 6 shows an aluminum support 35 of approximately 1.0 mm in thickness with a large number of recesses 36, each recess having an aperture 37, formed by press work, cutting work, or the like.

The above-described supports made of a metal material do not deform by the heat treatment applied to connect the second semiconductor layer to the support in the step (f), which will be described later, even if a low-temperature glass frit-type conductive paste or a resin-type conductive paste is used as a conductive adhesive. For example, a support made of aluminum does not deform even if the highest temperature of the heat treatment is as high as 550° C.

1-3) Step (e)

In this step, a conductive adhesive is applied to the periphery of each aperture in the recess of the support prepared in the step (d), in order to connect the second semiconductor layer of each photovoltaic element A1 to the support.

Figure 7:
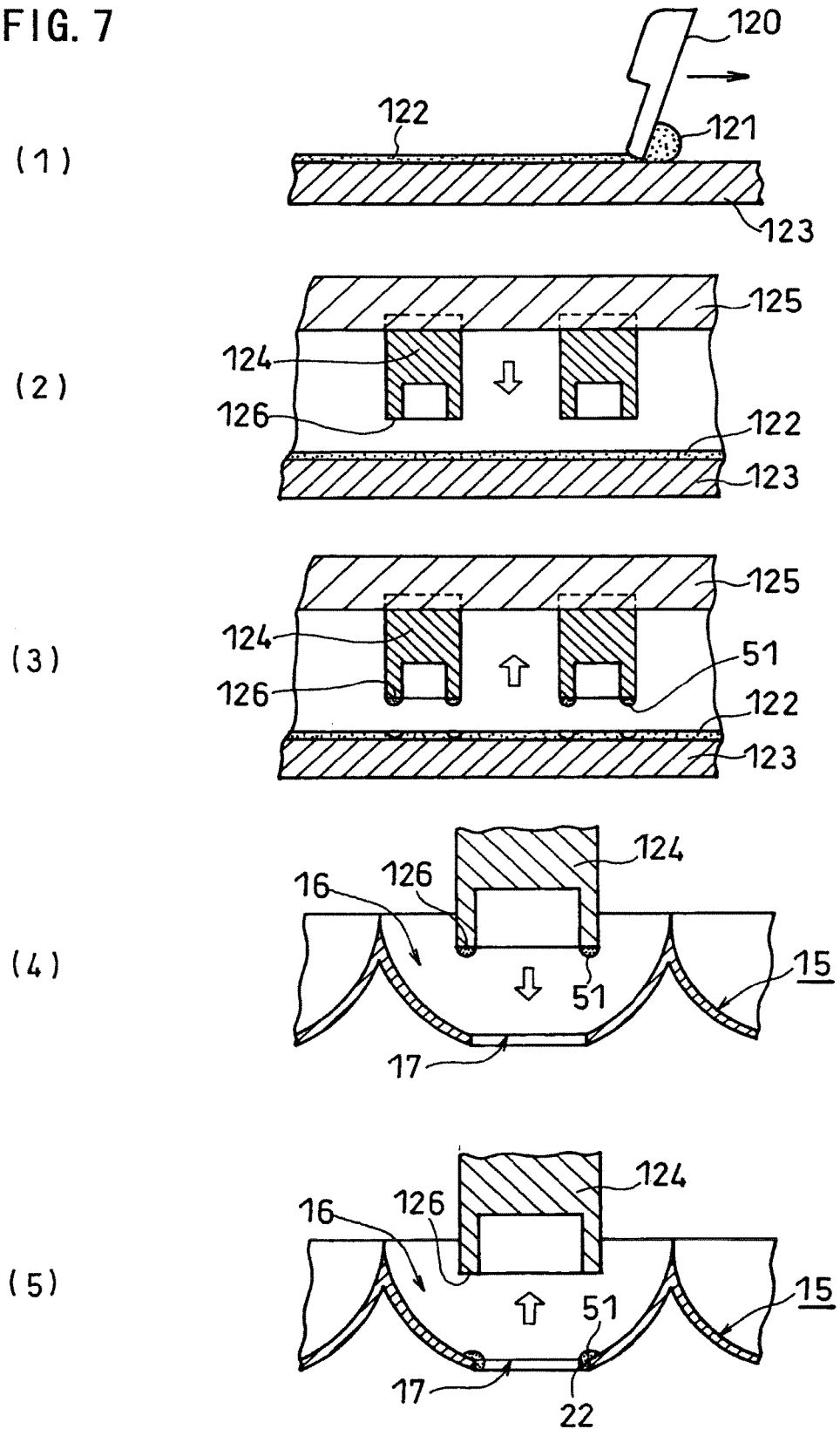
FIG. 7 are longitudinal sectional views showing the step of applying a conductive adhesive onto the support in step (e) of the present invention.

The conductive adhesive is preferably applied by transfer and screen printing. First, transfer is described with reference to FIG. 7. As illustrated in FIG. 7(1), a conductive adhesive 121 is placed on the flat surface of a metal plate 123, and by moving a squeezee 120 rightward, the conductive adhesive 121 is thinly spread over the plate 123, to form a conductive adhesive layer 122 with a uniform thickness. The viscosity of the conductive adhesive is adjusted to approximately 100 Pa·s. Subsequently, as illustrated in FIG. 7(2), a transfer plate 125, which has transfer pins 124 embedded therein at the same pitches as those of the apertures 17 of the support 15 of FIG. 3, is lifted down in the vertical direction, and edges 126 of the transfer pins 124 are brought into contact with the conductive adhesive layer 122. Then, as illustrated in FIG. 7(3), the transfer plate 125 with a conductive adhesive 51 applied to the edges 126 of the transfer pins is lifted up.

Next, as illustrated in FIG. 7(4), the transfer plate 125 is lifted down toward the support 15 such that the centers of the recess 16 and the transfer pin 124 align, and the edge 126 of the transfer pin is pressed against the periphery of the aperture 17. Thereafter, as illustrated in FIG. 7(5), the transfer pin 124 is lifted up. The edge 126 of the transfer pin is shaped like a ring, and the outer diameter is larger than the diameter of the aperture of the support by approximately 0.15 mm while the internal diameter is smaller than the diameter of the aperture of the support by approximately 0.15 mm. As a result, the conductive adhesive 51 adhering to the edge 126 of the transfer pin is transferred to the periphery of the aperture 17 of the support, so that the conductive adhesive 51 is applied to the periphery of the aperture of the support in the form of a ring.

The edge of the transfer pin may be in the form of a circle slightly larger than the diameter of the aperture of the support or may have a curved surface. Although the material of the transfer pin is not particularly limited, it is preferred to use a material that is relatively hard and excellent in chemical resistance, for example, metal such as stainless steel, fluorocarbon resin, or polypropylene.

Figure 8:
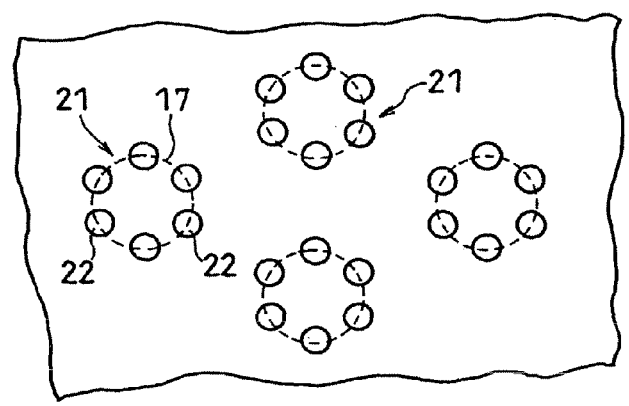
FIG. 8 is a plan view of a metal screen used in another application method in the above step of the present invention.

Next, screen printing is described. Since the portion to which the conductive adhesive is to be applied is located on the bottom of the recesses of the support, normal screen printing cannot be utilized. In this embodiment, by printing the conductive adhesive from the backside of the support, the conductive adhesive is applied to an area extending from the periphery of each aperture on the backside of the support to the periphery of the aperture on the frontside. As illustrated in FIG. 8, the metal mask used in screen printing has a plurality of opening groups 21 corresponding to the apertures 17 of the support 15 of FIG. 3. Each of the opening groups 21 consists of six openings 22 that are arranged along the opening edge of each aperture 17. Each of the openings 22 is shaped so as to cover an area extending from the outer part of the opening edge of the aperture 17 to the inner part thereof. The thickness of the support 15 around the aperture 17 is 0.12 mm, and the diameter of the aperture 17 is 0.85 mm. The thickness of the metal mask is 50 µm, and the diameter of the opening 22 is 0.3 mm.

Figure 9:
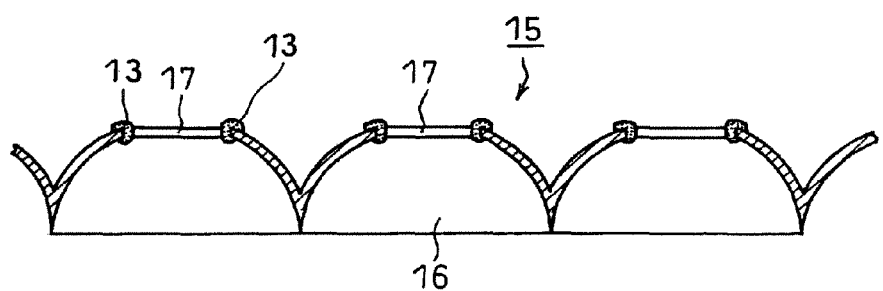
FIG. 9 is a longitudinal sectional view of the support with the conductive adhesive applied thereto with the metal screen of FIG. 8.

The metal mask is set on the backside of the support 15 such that the centers of the openings 22 are located on the opening edge of the aperture 17, and a conductive adhesive 13 in paste form is printed on the backside of the support 15. As a result, as illustrated in FIG. 9, the conductive adhesive 13 is applied to six locations around each aperture 17 in such a manner as to cover the periphery of the aperture 17, the inner wall of the aperture 17, and the inner face of the recess 16. The conductive adhesive is, for example, a resin-type conductive paste composed of a mixture of an epoxy-type adhesive and a Ag powder serving as a conductive agent, whose viscosity at 25° C. is 20 Pa·s.

1-4) Step (f)

In this step, each of the photovoltaic elements A1 prepared in the step (a) is disposed in each recess such that the second semiconductor layer thereof is in contact with the edge of the aperture in the recess of the support, whereby the second semiconductor layer is bonded to the periphery of the aperture with the conductive adhesive applied in the step (e). Further, the conductive adhesive is heated for solidification. This produces a structure B1 in which the elements A1 are fixed to the predetermined positions of the support such that their second semiconductor layers are electrically connected to the second conductor layer.

Figure 10:
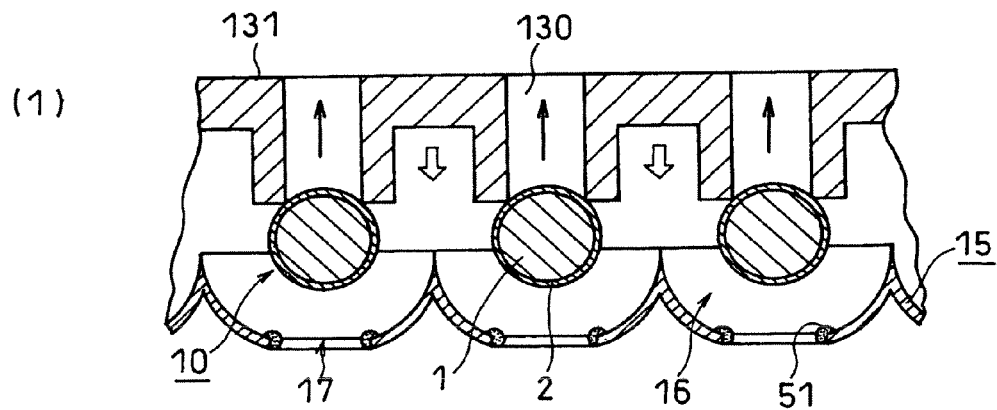
FIG. 10 are longitudinal sectional views showing the step of disposing photovoltaic elements A1 in the support with the conductive adhesive applied thereto in step (f) of Embodiments 1 to 3 of the present invention.
Figure 10:
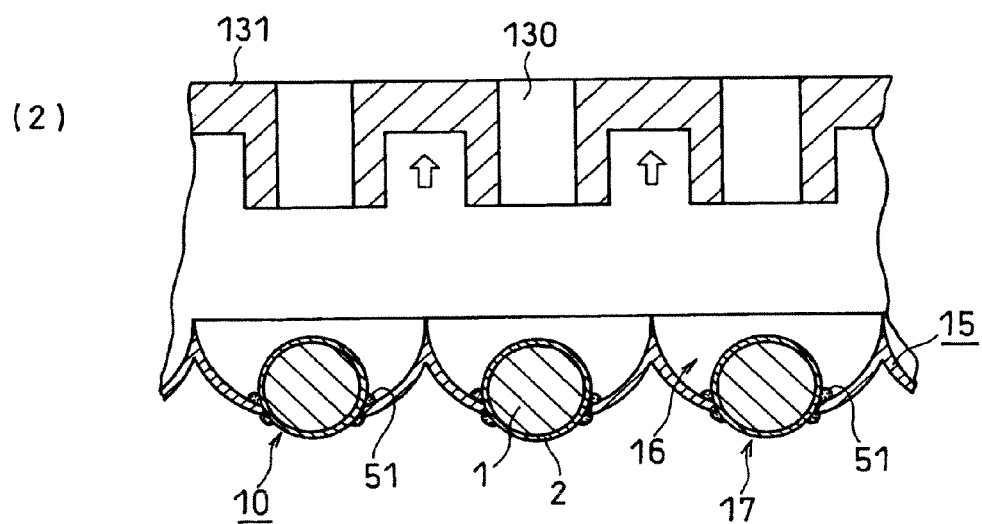

The method for producing the structure B1 is specifically described with reference to FIG. 10. While the conductive adhesive applied to the support in the step (e) is still adhesive before becoming dry, the elements A1 are disposed in the predetermined positions of the support in the following manner.

First, the pressure of air on the back side of a suction plate 131, in which a large number of suction holes 130 are formed in the same pattern as that of the apertures 17 of the support 15, is reduced to suck the elements 10 of FIG. 1 into the respective suction holes 130. The suction plate 131 is moved to a position above the support 15 of FIG. 7(5) such that the centers of the suction holes 130 and the apertures 17 align, and the suction plate 131 is lifted down as illustrated in FIG. 10(1). The suction plate 131 is lifted down until the second semiconductor layers 2 of the elements 10 come into contact with the peripheries of the apertures 17 in the recesses 16 of the support, and then pressed lightly while the pressure of air on the backside of the suction plate 131 is released to normal pressure. Subsequently, as illustrated in FIG. 10(2), the suction plate 131 is lifted up. As a result, each of the second semiconductor layers 2 adheres to the periphery of each aperture 17 with the conductive adhesive 51, without causing the conductive adhesive 51 to adhere to the inner face of the recess 16 except the periphery of the aperture 17.

Figure 11:
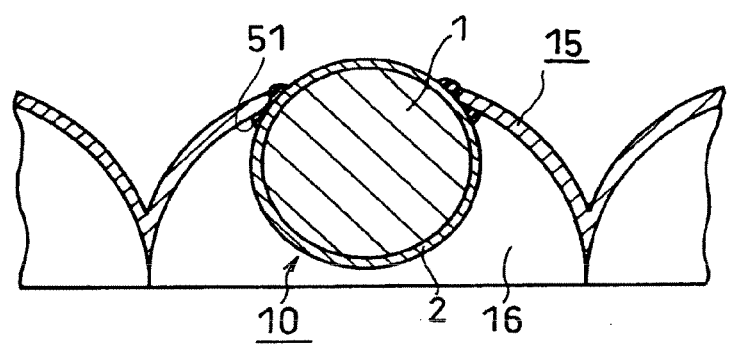
FIG. 11 is a longitudinal sectional view of the support with the photovoltaic element A1 disposed therein, which is obtained by the above step (f)

The support 15 with the elements 10 disposed therein in the above manner is heated to solidify the conductive adhesive 51, in order to produce a structure B1 in which the second semiconductor layers 2 of the elements 10 are firmly connected to the peripheries of the apertures 17 of the support, as illustrated in FIG. 11.

1-5) Step (b)

In this step, at least a part of the second semiconductor layer of each photovoltaic element A1 on the backside of the support of the structure B1 fabricated in the previous step (f) is removed to expose the first semiconductor. As a result, the elements A1 are converted to elements A2.

Specifically, etching, sandblasting, brushing, or a method employing a combination of these is used to remove the surface layer (thickness: approximately 1 to 3 µm) of the element A1 including the second semiconductor layer (thickness: less than 1 µm). In the case of sandblasting, an abrasive fine powder comprising, for example, alumina, is sprayed together with air on the backside of the structure B1 from a nozzle, whereby the surface layer of the element A1 including the second semiconductor layer on the backside of the support is removed with the abrasive. In the case of brushing, the surface layer is abraded, for example, by rotating a nylon brush with diamond abrasive grains attached thereto and bringing it into contact with the surface of the element A1 exposed to the backside of the support.

As stated in 1-1) above, the second semiconductor layer of the present invention encompasses a semiconductor layer formed on the surface of a first semiconductor and the semiconductor layer with an anti-reflection coating formed thereon. According to sandblasting and brushing, hard materials such as the anti-reflection coating and Si, particularly the anti-reflection coating, are easily abraded, but soft materials such as the aluminum support and conductive adhesive are not easily abraded. Thus, according to these methods, the surface layer of the element A1 on the backside of the support can be removed without causing substantial damage to the support.

In the case of etching, an etchant is brought into contact with the backside of the structure B1 to dissolve and remove the surface layer of the second semiconductor layer, followed by washing with water and drying. For example, using an etchant composed of a mixture of approximately 60% concentration hydrofluoric acid and approximately 40% concentration nitric acid in a volume ratio of 4:1, etching is done for 10 to 20 seconds. As another etchant, it is also possible to use an alkaline aqueous solution in which tetramethylammonium hydroxide and an oxidizing agent, such as hydrogen peroxide, are dissolved.

Although these etchants dissolve Si and the anti-reflection coating, they are unlikely to dissolve aluminum. Hence, by appropriately setting such conditions as treatment time, only the surface layer of the element A1 can be removed without causing substantial damage to the aluminum support. If a Ag reflecting mirror layer is formed on the surface of the support, it is preferred to use the above-mentioned alkaline aqueous solution that is unlikely to dissolve Ag.

According to the above-noted sandblasting and brushing, particularly the anti-reflection coating of the surface layer of the element A1 is easily removed. In contrast, according to etching, Si is more likely to be removed than the anti-reflection coating. If the second semiconductor layer has the anti-reflection coating, the characteristics of the above-mentioned methods are utilized. That is, it is effective to use sandblasting or brushing to mainly remove the anti-reflection coating, and then use etching to mainly remove the semiconductor layer.

Figure 12:
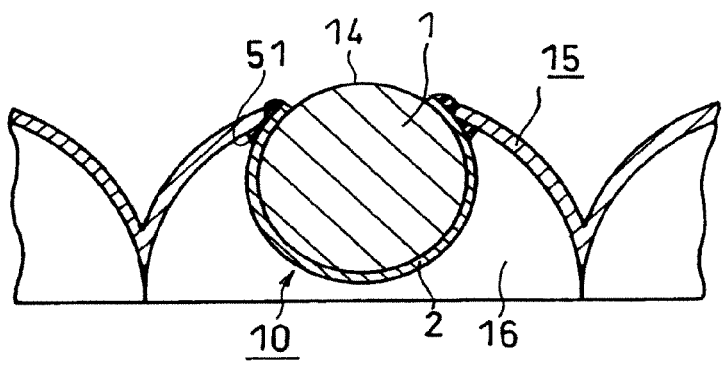
FIG. 12 is a longitudinal sectional view of a structure including a photovoltaic element A2, which is converted from the photovoltaic element A1 of FIG. 11 by step (b) of Embodiments 1 and 2.

Further, in the case of removing the second semiconductor layer only by sandblasting or brushing, it is also preferred to apply a slight etching to the surface to be abraded with the above-noted etchant and wash it with water, as appropriate, in order to facilitate the formation of an electrode in a subsequent step and avoid impairing the photovoltaic characteristics. According to the above-mentioned respective methods, a very thin surface layer is removed from the element A1, so the resultant element A2 remains almost spherical. FIG. 12 illustrates an exposed part 14 of the first semiconductor 1 formed on the backside of the support 15 of the structure B1 of FIG. 11.

In this step, in addition to the above methods, it is also possible to employ a method of removing the portion of the element A1 on the backside of the support by grinding or the like such that the opening of the second semiconductor layer is flush with the exposed part of the first semiconductor. According to this method, upon grinding, a load is applied to the element A1 fixed to the support from the backside of the support. It is thus necessary to give special consideration such that the element A1 is not separated from the support by this load.

1-6) Step (g)

In this step, an electrical insulator layer is formed on the backside of the support with the photovoltaic elements A2 incorporated therein.

The electrical insulator layer can be formed, for example, by bonding a resin sheet to the backside of the support with an adhesive or by thermo-compression bonding or the like. Exemplary materials of the resin sheet which may be used include resins such as polyimide-type, epoxy-type, polyether ether ketone-type, aromatic polyamide-type, polyether sulfone-type, polyetherimide-type, and fluorocarbon-type.

Figure 13:
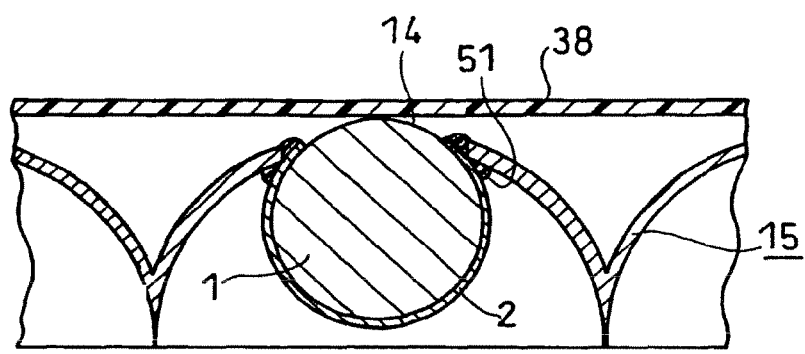
FIG. 13 are longitudinal sectional views showing the steps of forming an electrical insulator layer on the backside of the structure of FIG. 12 and forming a through-hole therein that serves as a conductive path in steps (g) and (h) of Embodiment 1.
Figure 13:
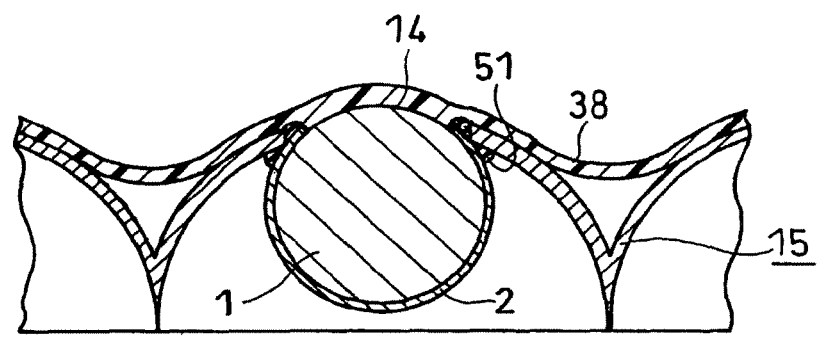
Figure 13:
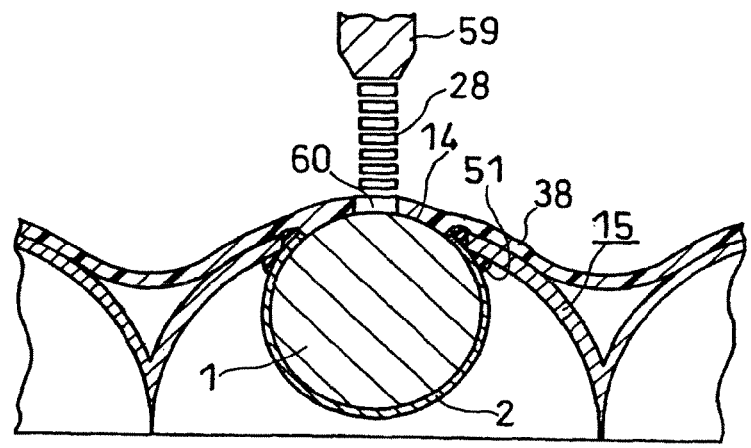

Referring now to FIG. 13, the method of forming the electrical insulator layer by using a resin sheet is specifically described. As illustrated in FIG. 13(1), the support 15 of FIG. 12 with the element A2 fixed thereto is placed with its light-receiving surface down, and a polyether ether ketone-type resin sheet 38 is disposed on the backside of the support 15. Subsequently, a heat treatment is applied thereto at approximately 380° C. for about 10 minutes, so that the resin sheet 38 is bonded to the backside of the support 15, as illustrated in FIG. 13(2). Even if a thin resin sheet with a thickness of approximately 50 μm is used, its adhesion to the backside of the support is very good, and its strength is also sufficient.

Another method for forming the electrical insulator layer by using a resin sheet is a method of using a semicured sheet composed mainly of a thermosetting resin, such as epoxy resin. According to this method, first, a resin sheet disposed on the backside of the support in the same manner as in FIG. 13(1) is pressed with a hot roll laminator heated to a relatively low temperature of approximately 120° C. This roll preferably has an elastic sheet, such as rubber, attached thereto. By this heating, the semicured resin sheet becomes flexible and adhesive to a suitable extent without becoming cured. Thus, by pressing the resin sheet as described above, the resin sheet can be bonded to the backside of the support in the same manner as in FIG. 13(2).

If this resin sheet is not subjected to the heat treatment to keep the sheet semicured, the resin sheet functions as an adhesive in the step (i), which will be described later. That is, by bonding a conductive metal sheet to this resin sheet with a hot roll laminator and then applying a heat treatment to cure the resin sheet, the support and the resin sheet, and the resin sheet and the metal sheet, are bonded firmly. Instead of the above-mentioned method using a hot roll laminator, it is also possible to stack the support and the resin sheet, or the resin sheet and the metal sheet, and heat them while reducing the pressure of air in the space between the two stacked members, in order to bond the two members together. As the resin sheet, in addition to the thermosetting resin sheet, it is also possible to use a sheet comprising a thermosetting resin and, for example, glass fibers mixed therein.

Still another method for forming the electrical insulator layer is a method of applying a resin paste by screen printing, spraying, offset printing, or the like and drying it. As the material of the resin paste, various resins such as epoxy-type, polyimide-type, silicone-type, urethane-type, and acryl-type may be used. In view of costs and operability, the use of an epoxy-type resin is most preferable. The resin paste is prepared by dissolving or dispersing such resin material in an organic solvent or water.

1-7) Step (h)

In this step, through-holes are formed in the electrical insulator layer prepared in the previous step (g). These through-holes are formed so as to expose at least a part of the exposed part of the first semiconductor of each photovoltaic element A2 prepared in the step (b). The through-holes serve as conductive paths that interconnect the electrodes of the respective elements A3 in the step (i) which will be described later.

In order to form such a through-hole in the electrical insulator layer, it is preferred to irradiate the part of the electrical insulator layer to be removed with a laser beam such that the resin of the irradiated part is decomposed. FIG. 13(3) illustrates the step of forming a through-hole in the electrical insulator layer of FIG. 13(2) prepared by bonding the resin sheet to the backside of the support. A part or the whole of the portion of the resin sheet 38 covering the exposed part 14 of the first semiconductor 1 is irradiated with a laser beam 28, to form a through-hole 60 in the irradiated part of the resin sheet 38. Using a 50 W YAG laser as a laser beam irradiation device 59, and with an irradiation time of approximately 0.01 second, the irradiated part of the resin sheet 38 with a diameter of approximately 100 to 150 μm can be removed. In the case of using a semicured resin sheet of epoxy resin-type, almost the same conditions as the above are also applicable to the formation of a through-hole. In the case of forming a through-hole in the electrical insulator layer prepared by applying a resin paste to the backside of the support, the above method is also applicable.

1-8) Step (c)

In this step, an electrode is formed on the exposed surface of the first semiconductor inside each through-hole prepared in the previous step (h). As a result, the photovoltaic elements A2 incorporated into the structure B1 are converted to elements A3.

Figure 14:
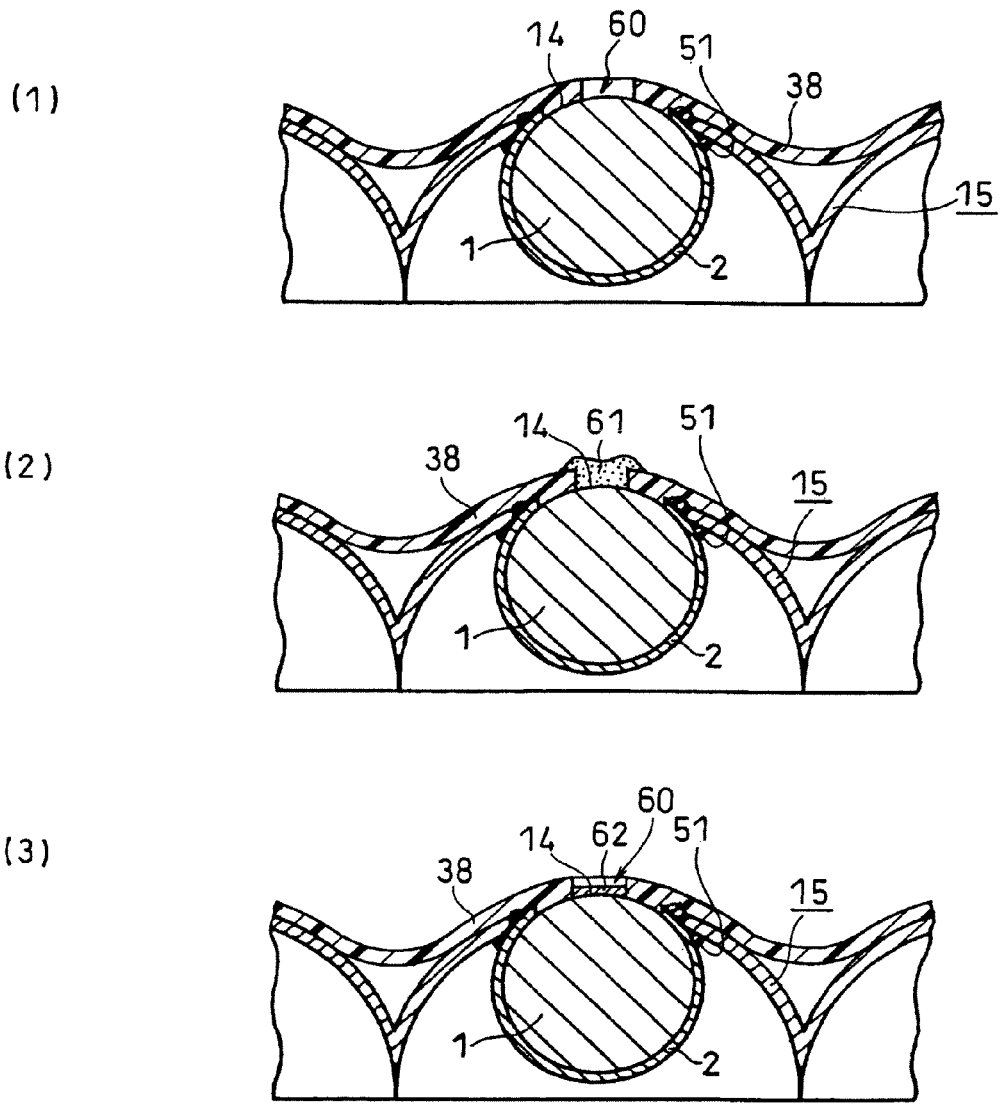
FIG. 14 are longitudinal sectional views showing the step of forming an electrode on the surface of the first semiconductor of the structure of FIG. 13 in step (c) of the above embodiment.

Referring now to FIG. 14, this step is specifically described. First, the structure of FIG. 14(1), in which the through-holes 60 were formed in the electrical insulator layer 38 in the previous step, is prepared. As illustrated in FIG. 14(2), a conductive paste 61 is filled into the through-hole 60 by printing or with a dispenser, to apply the conductive paste 61 to the exposed part 14 of the first semiconductor inside the through-hole 60.

Subsequently, the conductive paste 61 is locally heated by irradiating the conductive paste 61 with a laser beam, so that an electrode 62 is formed as illustrated in FIG. 14(3). The laser irradiation may be performed by using, for example, a YAG laser, at a scanning speed of 1000 mm/sec and a print pulse frequency of 10 µm. The conductive paste is preferably a glass frit-type conductive paste containing glass frit as a binder and a conductive agent such as silver or aluminum.

1-9) Step (i)

In this step, a first conductor layer is formed which electrically interconnects the electrodes of the photovoltaic elements A3 formed inside the through-holes of the electrical insulator layer in the previous step (c). The through-holes of the electrical insulator layer function as conductive paths for electrically interconnecting the electrodes.

Exemplary specific methods include a method of bonding a conductive metal sheet made of aluminum foil to the electrical insulator layer and a method of applying a conductive paste so as to interconnect the electrodes inside the through-holes of the electrical insulator layer and solidifying it.

Figure 15:
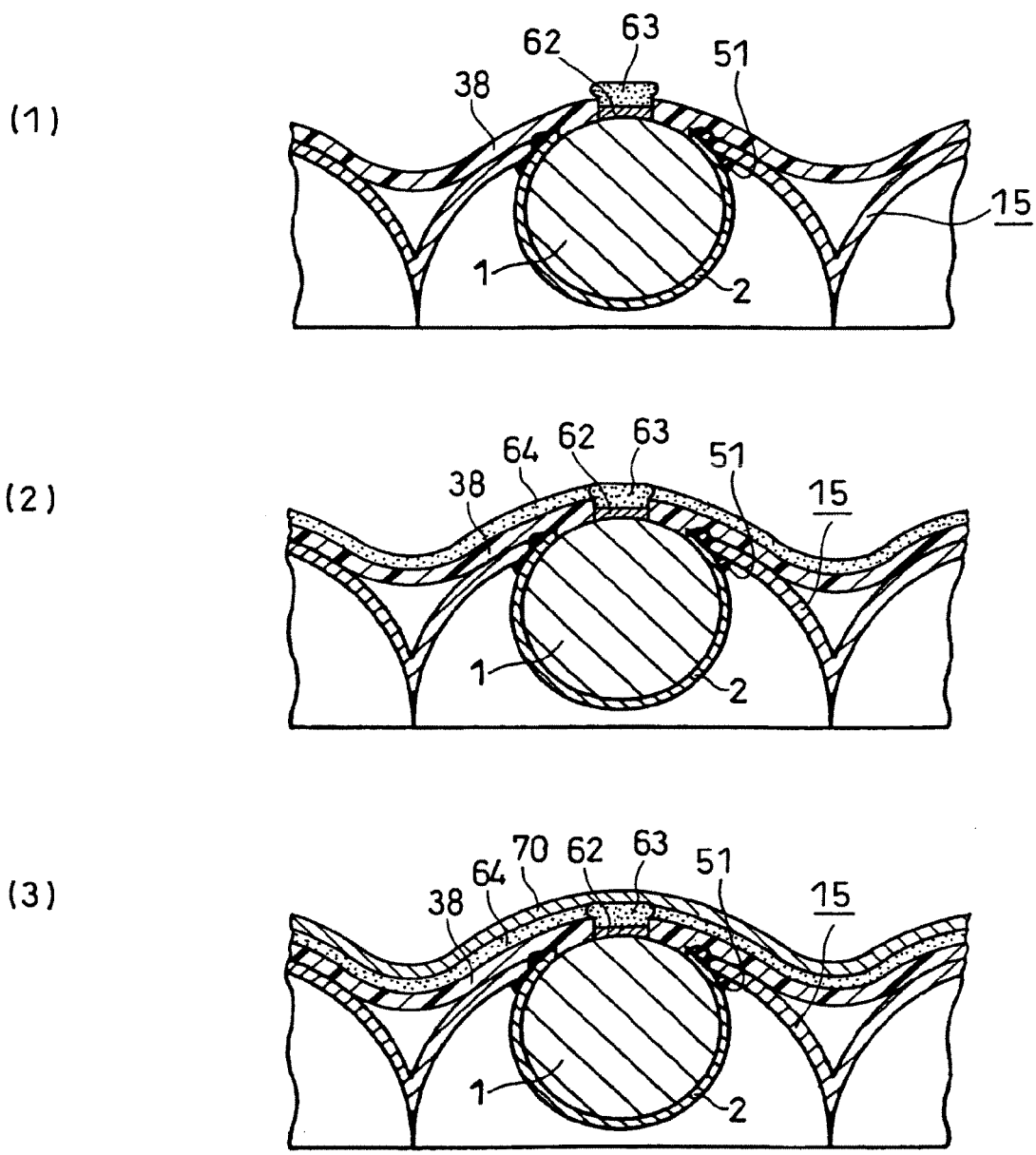
FIG. 15 are longitudinal sectional views showing the step of forming a first conductor layer on the electrical insulator layer of the structure of FIG. 14 by a first method of step (i) of the above embodiment.

In the case of forming the first conductor layer by using a metal sheet, first, a conductive paste is filled into each through-hole of the electrical insulator layer, to apply the conductive paste to the electrode surface. Subsequently, using this conductive paste as an adhesive, a metal sheet is bonded to the surface of the electrical insulator layer. For example, as illustrated in FIG. 15(1), a conductive paste 63 is filled into the through-hole of the electrical insulator layer 38. If necessary, as illustrated in FIG. 15(2), a conductive adhesive 64 is applied to the surface of the electrical insulator layer 38. Thereafter, as illustrated in FIG. 15(3), a metal sheet 70 is bonded thereto and subjected to a heat treatment to solidify the conductive paste 63 and the conductive adhesive 64. As a result, the metal sheet is bonded to the electrical insulator layer with the solidified conductive paste and conductive adhesive, and is fixed to the support side. In this way, the electrodes 62 of the respective elements are electrically connected to the metal sheet 70, to form the first conductor layer.

Figure 16:
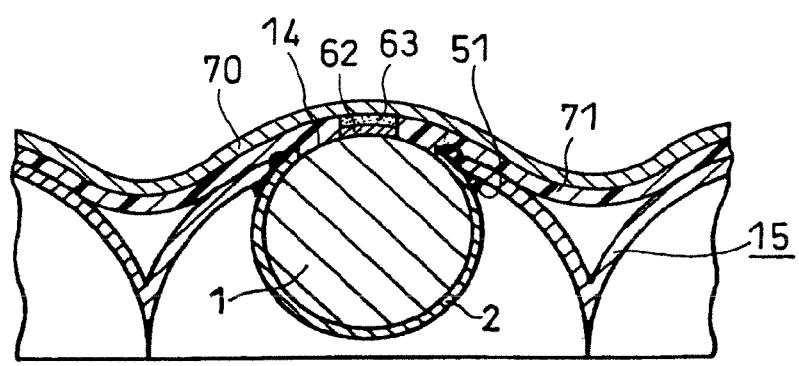
FIG. 16 is a longitudinal sectional view of a photovoltaic device with a first conductor layer formed by a second method of the above step.

Also, when the semicured thermosetting resin sheet was used as the electrical insulator layer in the step (g), first, a conductive paste is filled into the through-hole of the electrical insulator layer to apply the conductive paste to the electrode surface. Next, as described in 1-6), a metal sheet is placed on the electrical insulator layer, and they are bonded together under pressure with a hot roll laminator heated to approximately 120° C., followed by a heat treatment at 150 to 200° C. FIG. 16 illustrates the resultant first conductor layer. According to this method, the metal sheet 70 is firmly bonded to an electrical insulator layer 71 comprising a thermosetting resin sheet, without the need to use the conductive adhesive 64 of FIG. 15 applied to the surface of the electrical insulator layer. As a result, the respective electrodes 62 are electrically connected to the metal sheet 70 in a reliable manner. The conductive metal sheet used in the above-mentioned methods may be, for example, a thin plate with a thickness of approximately 50 to 100 µm, comprising nickel, copper, or stainless steel, in addition to aluminum.

Next, the method of forming the first conductor layer by applying a conductive paste so as to interconnect the electrodes inside the through-holes of the electrical insulator layer and solidifying the conductive paste is described below. The conductive paste may be applied by dispensing, screen printing, offset printing, and spraying. If the backside of the support is irregular, dispensing and spraying are preferred since these methods can apply a conductive paste to even the depressions of the irregular surface.

Figure 17:
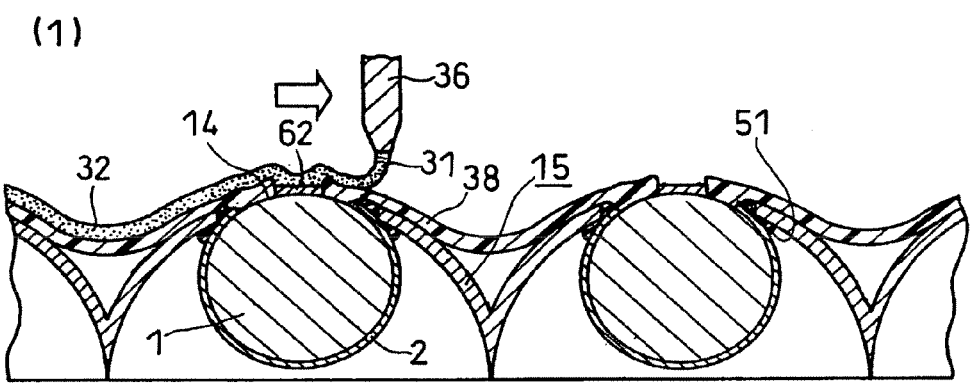
FIG. 17 are longitudinal sectional views showing the step of forming a first conductor layer by a third method of the above step.
Figure 17:
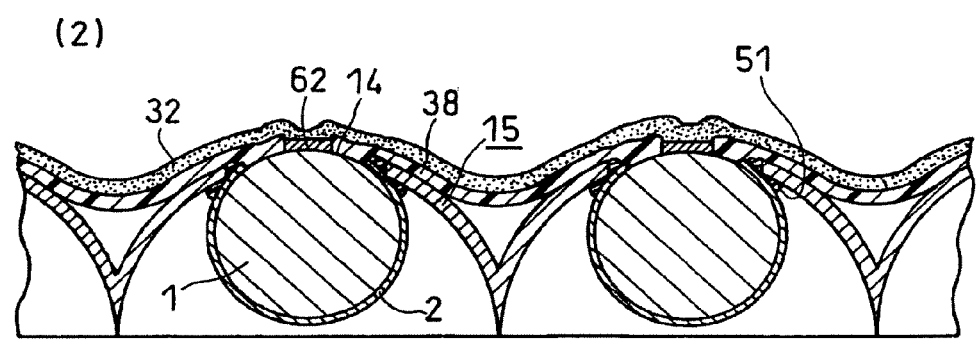

FIG. 17 illustrates the step of forming the first conductor layer by applying a conductive paste by dispensing and applying a heat treatment. As illustrated in FIG. 17(1), while dispensing a conductive paste 31 from a nozzle 36 of a dispenser, the nozzle 36 is moved along the straight line connecting the electrodes 62 inside the respective through-holes in the electrical insulator layer 38 on the backside of the support 15 of the structure of FIG. 14(3). As a result, as illustrated in FIG. 17(2), a coating layer 32 of conductive paste is formed in the form of a line on the electrical insulator layer 38. This coating layer 32 interconnects the electrodes 62 of the respective elements fixed to the support 15 on the electrical insulator layer 38.

Figure 18:
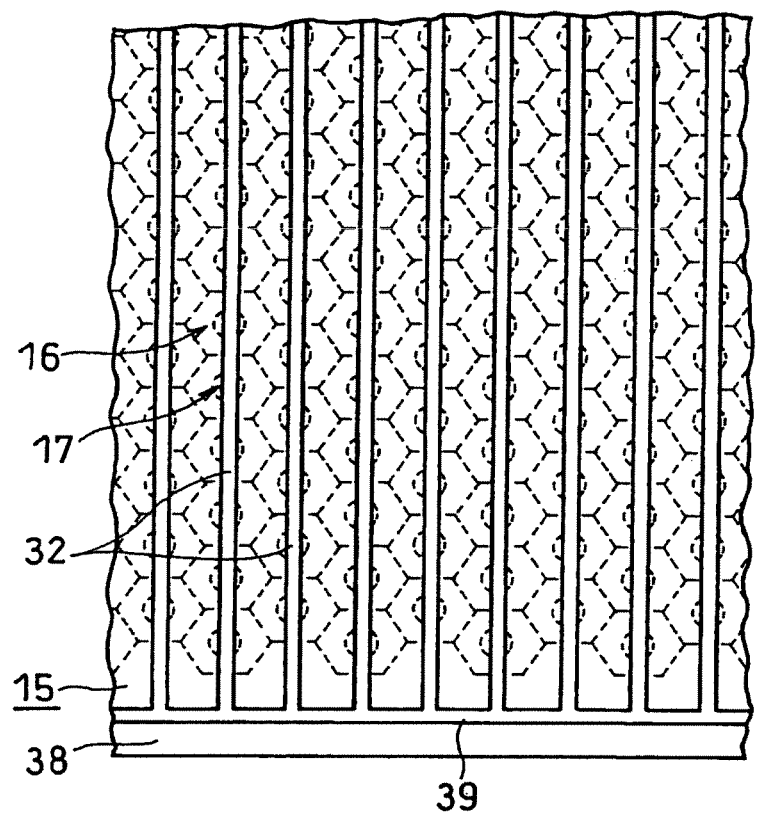
FIG. 18 is a plan view showing an application pattern of the conductive paste applied to the electrical insulator layer in the step of FIG. 17.

FIG. 18 illustrates the application pattern of the coating layer 32 formed in the above manner. FIG. 18 is a plan view of the backside of the support 15 with the coating layers 32 of conductive paste formed in the step of FIG. 17. For the purpose of simplification, the details such as the electrodes and the through-holes of the electrical insulator layer are omitted from the figure. The coating layers 32 are formed on the electrical insulator layer 38 so as to interconnect the electrodes of the elements fixed to the large number of recesses 16 that are aligned in straight lines. The line width of each coating layer 32 is slightly smaller than the diameter of each aperture 17 of the support and substantially equal to the diameter of the exposed part of each first semiconductor. Judging from the electrical characteristics of the photovoltaic device, the line width of the coating layer 32 should be 310 µm or more. The respective edges of the coating layers 32 that are aligned in parallel are connected by a linear coating layer 39 of conductive paste formed at the edge of the support 15.

In addition to the above-described application pattern, it is also possible to employ, for example, a net-like pattern consisting of linear coating layers of conductive paste, where respective electrodes are located at the intersections of the linear coating layers. That is, the application pattern may be such that the respective electrodes of the elements A3 mounted in the support are insulated from the support and the second semiconductor layers by the electrical insulator layer while they are interconnected in some form or other with the conductive paste. For example, the conductive paste may be applied to the whole surface of the electrical insulator layer by printing.

By applying a heat treatment to the coating layer of conductive paste, a first conductor layer comprising the solidified conductive paste is formed. According to this method, the first conductor layer can be formed at a high speed, and the number of components can be reduced.

It is preferred that the conductive paste and conductive adhesive used in the above methods solidify at temperatures that do not cause damage, such as deformation or deterioration, to the electrical insulator layer. Normally, a resin-type conductive paste that solidifies at a relatively low heat-treatment temperature of 100 to 200° C. is used. When the electrical insulator layer is composed of a material with a relatively high heat resistance, such as fluorocarbon resin, a low-temperature glass frit-type conductive paste can be used.

Embodiment 2

This embodiment is directed to a production method in which steps (a) and (d) are performed and then steps (e), (f), (b), (c), (g), (h), and (i) are performed in this order.

This embodiment is the same as Embodiment 1 until the exposed part of the first semiconductor is formed on each photovoltaic element A1 incorporated into the structure B1, but is different from Embodiment 1 in that the electrode is formed before the electrical insulator layer is formed.

2-1) Steps (a), (d), (e), (f), and (b)

By these steps, a structure B1 is formed, and the second semiconductor layer of each photovoltaic element A1 on the backside of the support is removed. As a result, the elements A1 are converted to elements A2. These steps can be carried out by completely the same sequence and methods as those of Embodiment 1.

2-2) Step (c)

Figure 19:
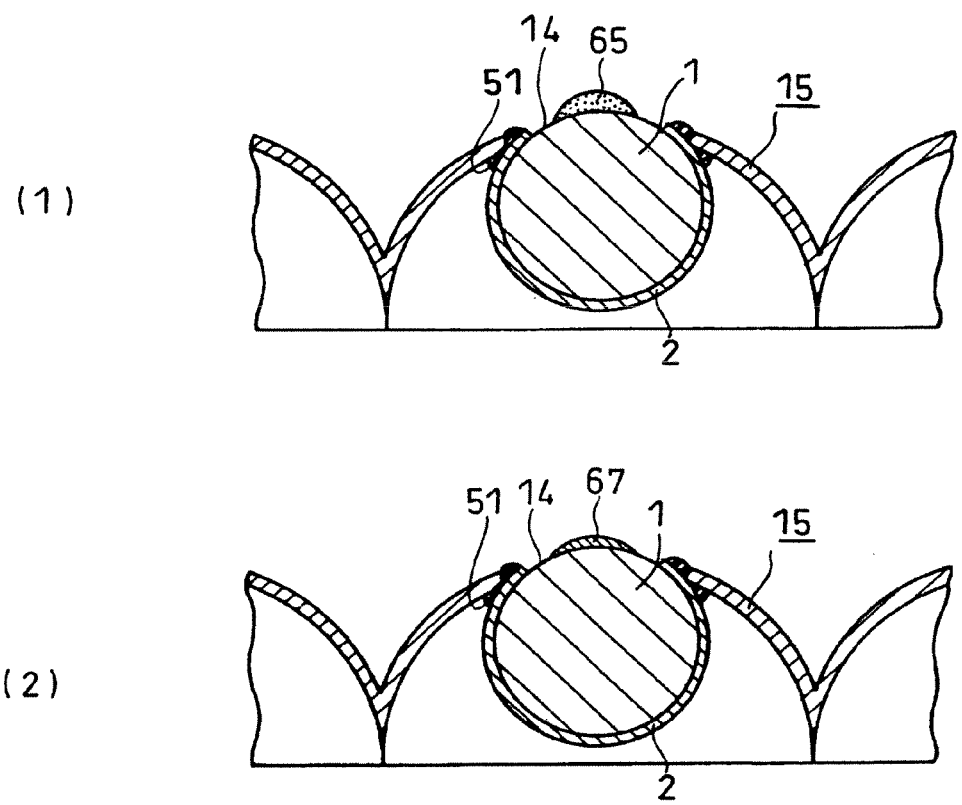
FIG. 19 are longitudinal sectional views showing the step of forming an electrode on the photovoltaic element A2 of the structure of FIG. 11 in step (c) of Embodiment 2 of the present invention, whereby the photovoltaic element A2 is converted to a photovoltaic element A3.

In this step, an electrode is formed on the exposed part of the first semiconductor of each photovoltaic element A2 prepared in the previous step (b). As a result, the elements A2 are converted to elements A3. FIG. 19 illustrates this step. First, as illustrated in FIG. 19(1), a conductive paste 65 is applied to the exposed part 14 of the first semiconductor of the structure of FIG. 12 by printing or with a dispenser. Next, as illustrated in FIG. 19(2), an electrode 67 is formed by locally irradiating the applied part of the conductive paste 65 with a laser beam to heat it. The method of laser irradiation and the conductive paste used are the same as those as described in 1-8) of Embodiment 1.

2-3) Steps (g) and (h)

Figure 20:
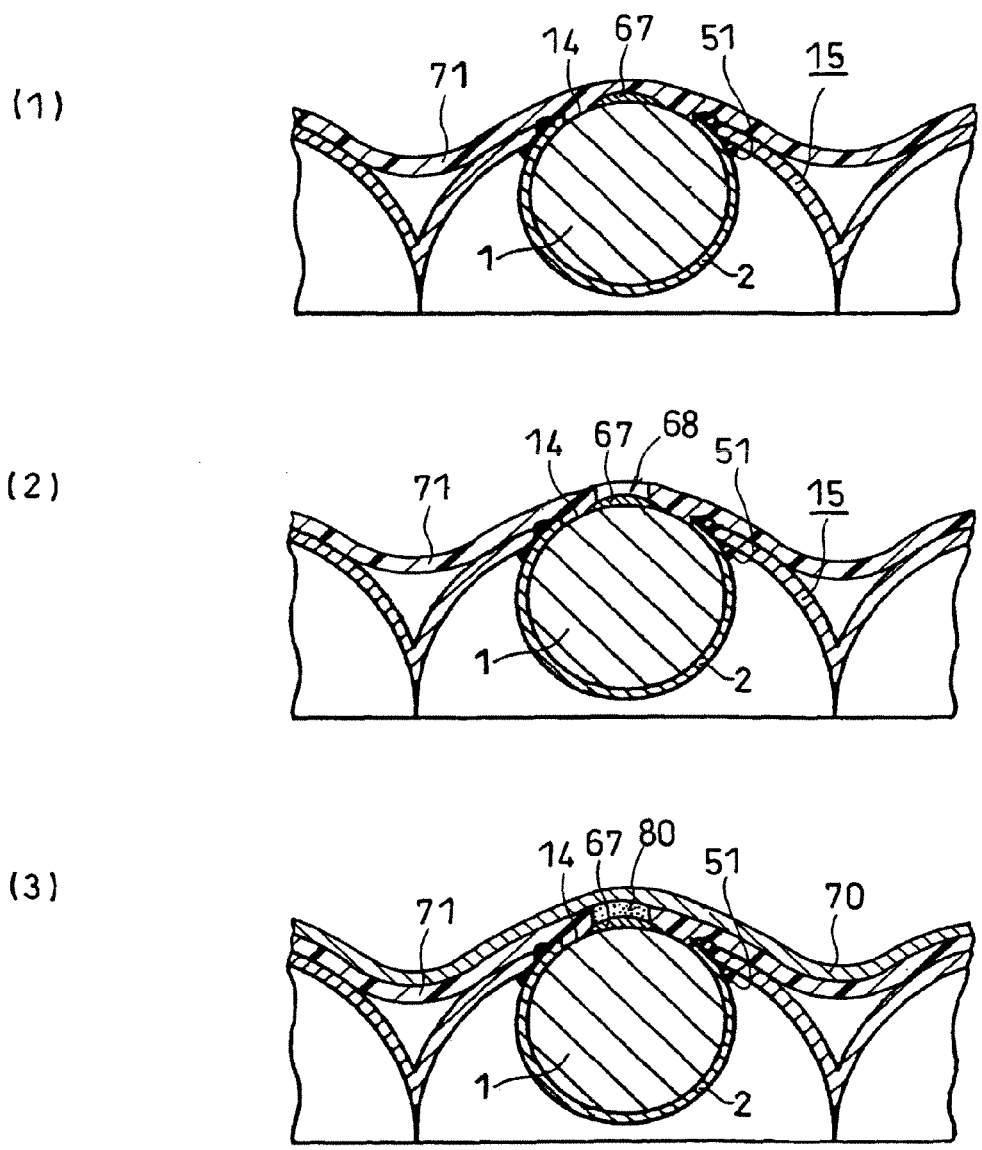
FIG. 20 are longitudinal sectional views showing the steps of forming an electrical insulator layer on the backside of the structure obtained by the step of FIG. 19 and forming a first conductor layer thereon, in steps (g), (h), and (i) of Embodiment 2 of the present invention.

In this embodiment 2, after the previous step (c) of forming the electrode on the exposed part of the first semiconductor, the step (g) is performed to form an electrical insulator layer on the backside of the support, and the step (h) is then performed to form through-holes in the electrical insulator layer so as to expose the electrodes. Since the steps (g) and (h) are the same as those of Embodiment 1 except that the base underlying the electrical insulator layer is slightly different, they can be carried out in accordance with the methods as described in 1-6) and 1-7) of Embodiment 1. Exemplary modes are illustrated in FIG. 20(1) and FIG. 20(2). FIG. 20(1) illustrates an electrical insulator layer 71, comprising a thermosetting resin sheet, bonded to the backside of the structure of FIG. 19(2), and FIG. 20(2) illustrates the electrical insulator layer 71 with a through-hole 68 formed therein.

2-4) Step (i)

In this step, a first conductor layer is formed which electrically interconnects the electrodes of the photovoltaic elements A3, with the through-holes of the electrical insulator layer formed in the previous step (h) as conductive paths.

Specifically, the same methods as those of FIGS. 15 to 18 as described in 1-9) of Embodiment 1 can be performed. For example, as illustrated in FIG. 20(3), a conductive paste 80 is filled into the through-hole of the electrical insulator layer 71 of FIG. 20(2) to apply the conductive paste 80 onto the electrode 67, and a metal sheet 70 is bonded to the electrical insulator layer 71.

In 2-1) to 2-4) above, the second preferable embodiment of the production method of the photovoltaic device according to the present invention has been described. Hereinafter, other modifications encompassed by the second embodiment are described. This production method is completely the same as the above until the step (c), but the subsequent steps (g), (h), and (i) are different.

In this method, as the step corresponding to the step (g), an electrical insulator layer and a conductive metal sheet are bonded to the backside of the support of the structure with the electrodes formed in the step (c) of 2-2). Subsequently, as the step corresponding to the step (h), through-holes are formed in the electrical insulator layer and the metal sheet to expose the electrodes of the elements A3. Thereafter, as the step (i), a conductive paste is filled into the through-holes, and a heat treatment is applied to solidify the conductive paste. As a result, the electrodes are electrically connected to the metal sheet with the solidified conductive paste inside the through-holes, with the electrical insulator layer interposed therebetween, to form a first conductor layer.

A preferable method is as follows. In the step (g), first, an electrically insulating adhesive layer is formed on the backside of the support. Next, a composite sheet consisting of a conductive metal sheet and an electrical insulator layer bonded to one side of the conductive metal sheet is prepared, and the electrical insulator layer of the composite sheet is bonded to the adhesive layer. The adhesive layer is formed by applying a paste-like adhesive by screen printing, spraying, offset printing, or the like. As the material of the adhesive, for example, epoxy-type, polyimide-type, silicone-type, urethane-type, or acryl-type resin is used. An exemplary preferable composite sheet is composed of an electrical insulator layer comprising a 25-µm-thick polyethylene terephthalate film, and a 20-µm-thick aluminum sheet bonded to the electrical insulator layer.

Figure 21A:
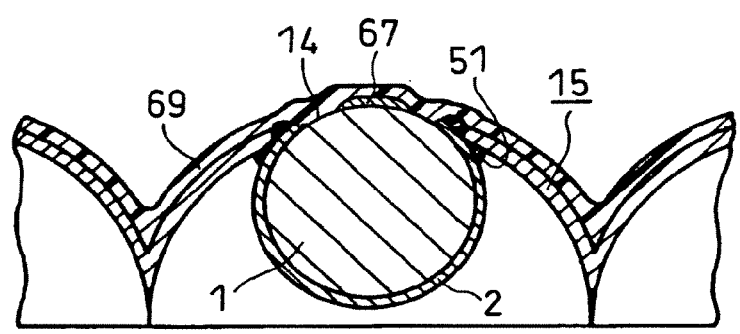
FIGS. 21A and 21B are longitudinal sectional views showing another method of forming an electrical insulator layer and a first conductor layer in the above steps.
Figure 21A:
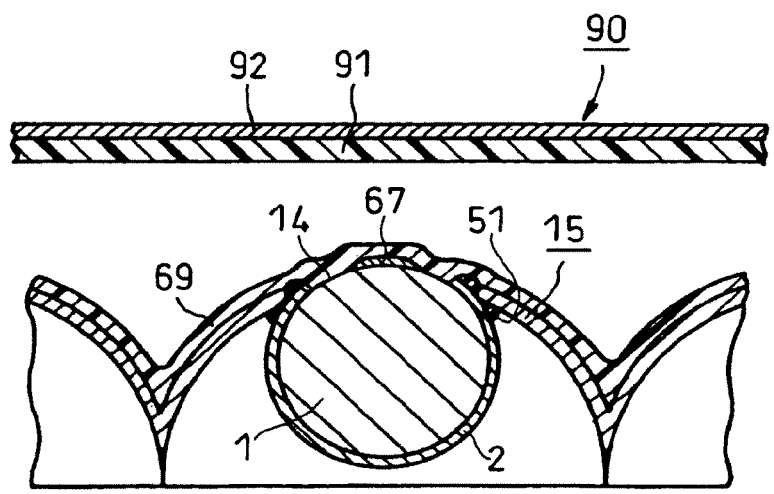
Figure 21B:
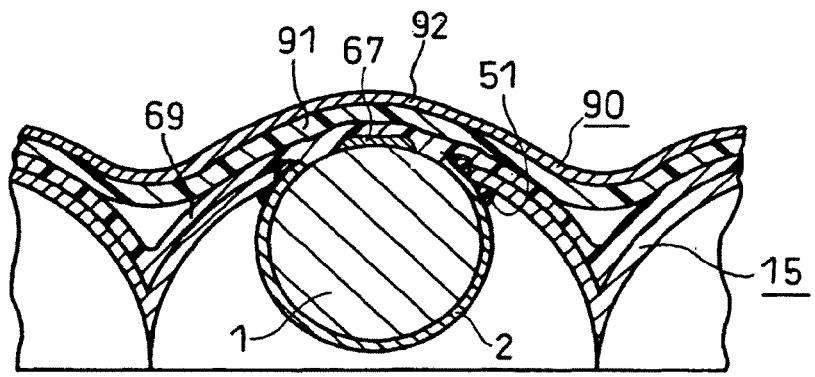
Figure 21B:
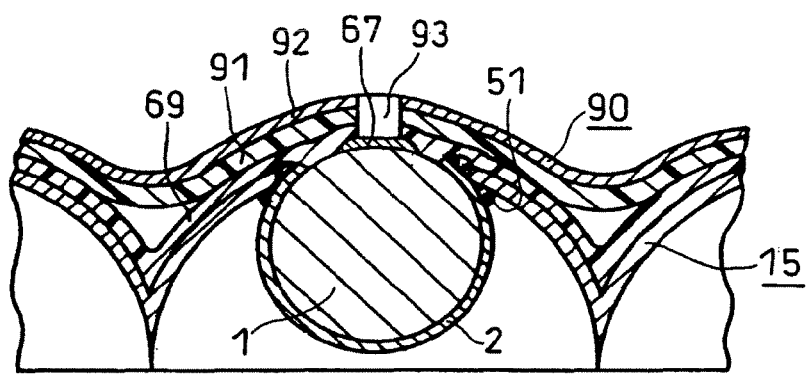
Figure 21B:
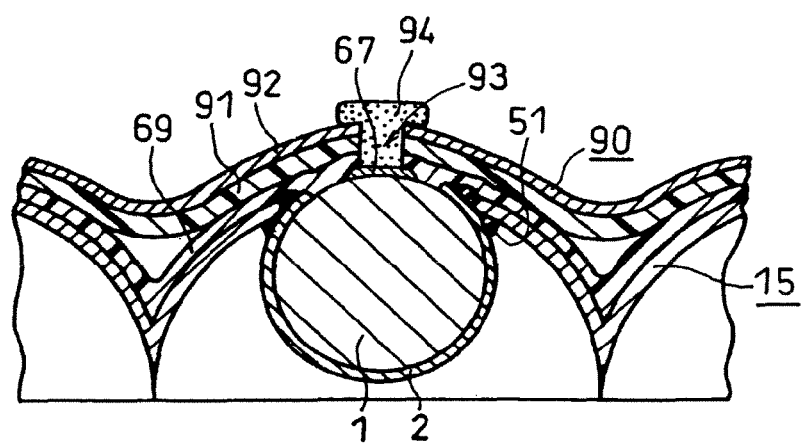

This production method is illustrated in FIG. 21A and FIG. 21B. First, as illustrated in FIG. 21A(1), an adhesive layer 69 is formed on the backside of the support 15 of the structure of FIG. 19(2). Subsequently, as illustrated in FIG. 21A(2), a composite sheet 90 consisting of a metal sheet 92 and an electrical insulator layer 91 is placed on the adhesive layer 69 of the support 15, and the electrical insulator layer 91 of the composite sheet 90 is bonded to the support 15 while the pressure therebetween is reduced. As illustrated in FIG. 21B(3), the composite sheet 90 adheres to the adhesive layer 69 on and around the electrode 67 of the element. When the support 15 is composed of a thin metal sheet, the adhesive layer on the backsides of the partitions between the recesses produces the effect of reinforcing the partitions of the support and the effect of more firmly fixing the elements to the support. After the composite sheet is bonded, a heat treatment is applied to solidify or cure the adhesive layer, if necessary. In this step, it is also possible to bond the resin sheet of the electrical insulator layer or the insulating adhesive layer to the backside of the support and then bond the metal sheet thereto.

Next, the part corresponding to the center of the aperture 17 of the support is irradiated with a laser beam. As a result, as illustrated in FIG. 21B(4), the irradiated part of the metal sheet 92, electrical insulator layer 91 and the adhesive layer 69 is removed, to form a through-hole 93 inside which the electrode 67 is exposed. Using a YAG laser with an output of 12 W as a laser beam irradiation device, and with an irradiation time of approximately 0.017 second, the through-hole 93 with a diameter of approximately 100 to 150 µm can be formed.

Thereafter, as illustrated in FIG. 21B(5), a conductive paste 94 is filled into the through-hole 93 to connect the electrode 67 of each element to the metal sheet 92 with the conductive paste. The conductive paste is preferably a resin-type conductive paste. If the material of the electrical insulator layer has a relatively high heat resistance, such as fluorocarbon resin, a low-temperature glass frit-type conductive paste can also be used. The conductive paste may be applied by dispensing, screen printing, offset printing, and spraying.

Embodiment 3

This embodiment is directed to a production method in which steps (a) and (d) are performed and then steps (e), (f), (g), (h), (b), (c), and (i) are performed in this order. This embodiment is the same as Embodiments 1 and 2 until the structure B1 is formed. Thereafter, the through-holes are formed in the electrical insulator layer on the backside of the structure B1 to expose the first semiconductors inside the through-holes, and the electrode is formed on the exposed surfaces of the first semiconductors.

3-1) Steps (a), (d), (e), and (f)

By these steps, a structure B1 with photovoltaic elements A1 fixed to the support is fabricated. These steps are carried out by completely the same sequence and methods as those of Embodiment 1.

3-2) Steps (g) and (h)

Figure 22:
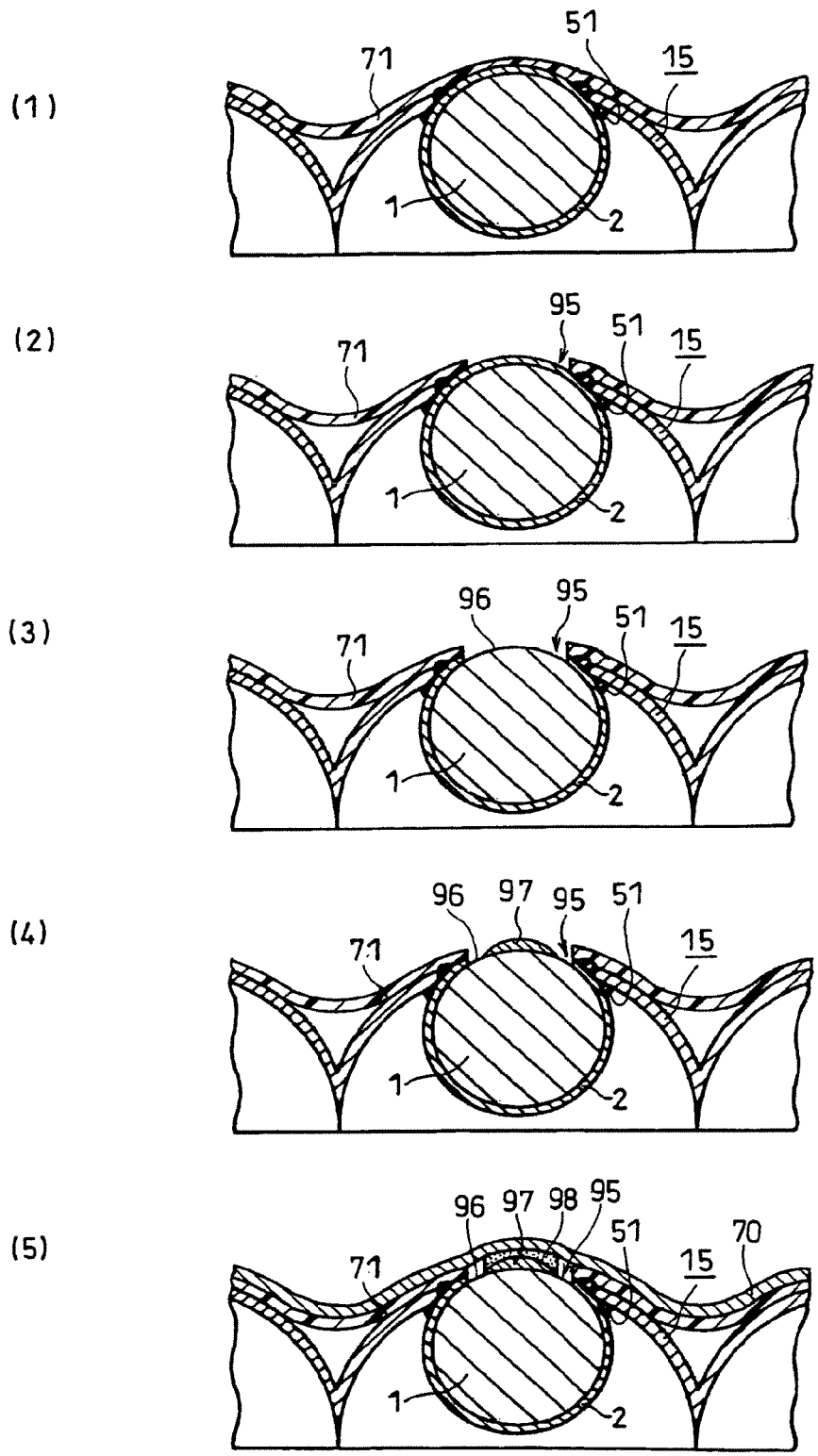
FIG. 22 are longitudinal sectional views showing the steps from the step of converting the photovoltaic element A1 of a structure B1 into a photovoltaic element A3 to the step of forming a first conductor layer in steps (g), (h), (b), (c), and (i) of Embodiment 3 of the present invention.

In this embodiment, the step (g) is performed to form an electrical insulator layer on the backside of the structure B1, and the step (h) is then performed to make through-holes in the electrical insulator layer in order to expose the second semiconductor layers therein. The sequence of these steps is different from that of Embodiment 1 where the exposed parts of the first semiconductors are formed, the electrical insulator layer is formed, and the through-holes are made in the electrical insulator layer. In these two embodiments, the base underlying the electrical insulator layer is slightly different. However, in this embodiment 3, the steps (g) and (h) can be performed in accordance with the methods as described in 1-6) and 1-7) of Embodiment 1. Representative examples are shown in FIG. 22(1) and FIG. 22(2). FIG. 22(1) illustrates an electrical insulator layer 71, which comprises a thermo-setting resin sheet, bonded to the backside of the support 15 of the structure of FIG. 11, and FIG. 22(2) illustrates the electrical insulator layer 71 with a through-hole 95 formed therein so as to expose the second semiconductor layer 2.

3-3) Step (b)

In this step, the second semiconductor layer that is exposed inside the through-hole 95 formed in the previous step (h) is removed. As a result, the photovoltaic elements A1 incorporated in the structure B1 are converted to elements A2 with a part of the first semiconductor exposed.

In this embodiment, etching is appropriate as the method for removing the second semiconductor layer. This is because the electrical insulator layer bonded to the backside of the support prevents the surface of the support from coming into contact with an etchant and being eroded. For example, an etchant, which may be the liquid mixture of hydrofluoric acid and nitric acid used in 1-5) of Embodiment 1, is brought into contact with only the backside of the support for approximately 20 seconds, followed by washing with water and drying. As a result, as illustrated in FIG. 22(3), the surface layer of approximately 1 to 3 μm in depth including the second semiconductor layer 2 inside the through-hole 95 is removed, so that an exposed part 96 of the first semiconductor 1 is formed in the through-hole.

3-4) Step (c)

In this step, an electrode is formed on the exposed surface of the first semiconductor of the photovoltaic element A2 prepared in the previous step (b) inside the through-hole 95. As a result, the elements A2 are converted to elements A3.

In this step, the electrode can be formed by the same method as that of 1-8) of Embodiment 1. FIG. 22(4) illustrates an electrode 97 formed on the exposed part 96 of the first semiconductor inside the through-hole 95 of the electrical insulator layer.

3-5) Step (i)

In this step, a first conductor layer is formed which electrically interconnects the electrodes of the photovoltaic elements A3, with the through-holes 95 made in the previous step (h) as conductive paths.

In the same manner as in 1-9) of Embodiment 1, this step can be performed by the method of bonding a conductive metal sheet to the electrical insulator layer with a conductive adhesive, the method of applying a conductive paste so as to interconnect the electrodes inside the through-holes of the electrical insulator layer and solidifying it, or the like. For example, as illustrated in FIG. 22(5), the electrode 97 of each element is electrically connected to a metal sheet 70 with a conductive paste 98 filled into the through-hole 95 of the electrical insulator layer 71.

Embodiment 4

This embodiment is directed to a production method in which steps (a), (b), (c), and (d) are performed and then steps (e), (f), (g), (h), and (i) are performed in this order.

This embodiment is different from Embodiments 1 to 3 where the photovoltaic elements A1 are mounted in the support to fabricate the structure B1. Instead, photovoltaic elements A3 with electrodes are mounted in the support to fabricate a structure B2, and through this step, a photovoltaic device is produced.

4-1) Step (a)

In this step, a plurality of photovoltaic elements A1 are prepared by the same method as that of 1-1) of Embodiment 1.

4-2) Step (b)

In this step, at least a part of the first semiconductor of each photovoltaic element A1 prepared in the previous step (a) is exposed to obtain elements A2.

A preferable method of this step is a method of removing a part of the elements A1 by grinding. Specifically, first, a supporting member is prepared which has a large number of recesses in a predetermined pattern, each recess having a predetermined depth. The elements A1 are placed in the respective recesses so that a part thereof is exposed. Subsequently, molten wax is applied to the supporting member and cooled for solidification. As a result, the elements A1 are fixed to the recesses of the supporting member with the solidified wax. A rotary grinder is then pressed against the exposed part of each element A1 to grind and remove the exposed part of the element A1. Thereafter, the wax is heated for vaporization or thermal decomposition to remove the wax from the surface of the element.

Figure 23:
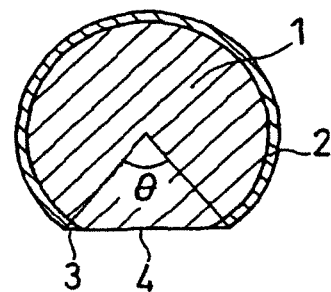
FIG. 23 is a longitudinal sectional view of a photovoltaic element A2 obtained by step (b) of Embodiment 4 of the present invention.
Figure 24:
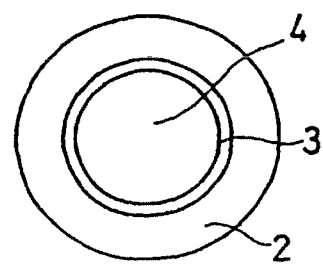
FIG. 24 is a bottom view of the photovoltaic element A2 of FIG. 23.

FIG. 23 shows a cross-section of the element A2 produced in the above method, and FIG. 24 shows a bottom face thereof. A part of the first semiconductor 1 covered with the second semiconductor layer 2 is cut off, and an opening 3 of the second semiconductor layer is formed at the circumference of the flat cut cross-section. An exposed part 4 of the first semiconductor layer is formed inside the opening 3. The central angle θ formed by connecting the central point of the element A2 to opposing two points on the circumference of the opening may be 45 to 90°, and preferably 60 to 90°. In this case, the area of the opening is appropriate for electrically connect the first semiconductor to the first conductor layer.

Figure 25:
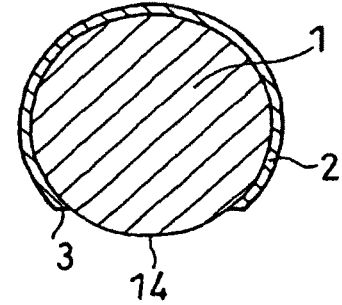
FIG. 25 is a longitudinal sectional view of another photovoltaic element A2 obtained by the above step.

The element A2 can also be obtained by masking the surface of the element A1, except a part thereof, with paraffin or the like and applying an etching process to remove the part of the second semiconductor layer other than the masked part. FIG. 25 shows a cross-section of the element A2 obtained in this method. Since the second semiconductor layer 2 is very thin, the outer shape of the element A2 of FIG. 25 remains almost unchanged from that of the element A1, in the same manner as in the element 10 of FIG. 12.

4-3) Step (c)

In this step, an electrode is formed on the exposed part of the first semiconductor of each photovoltaic element A2 prepared in the previous step (b), to obtain elements A3.

The electrode can be formed, for example, by applying a conductive paste to the exposed part of the first semiconductor of the element A2 and applying a heat treatment thereto. When the first semiconductor is a p-type semiconductor, it is preferred to use a glass frit-type conductive paste in which aluminum powder or a mixture of aluminum powder and silver powder or the like is dispersed as a conductive agent. When the first semiconductor is an n-type semiconductor, it is preferred to use a mixture of a phosphorous compound and Ag powder as a conductive agent. By drying the applied conductive paste and applying a heat treatment, a good conductive layer (electrode) is obtained.

Specifically, in the previous step (b), according to the method as described in 4-2), the elements A1 are fixed to the large number of recesses of the supporting member with the wax, and the parts of the elements A1 exposed from the recesses are ground to expose the first semiconductors, to produce elements A2. The elements A2 are left fixed to the supporting member as they are. In this step, a conductive paste is applied by printing or the like to the exposed parts of the first semiconductors of the elements A2 fixed to the recesses in the predetermined pattern, followed by heating at 400 to 800° C. As a result, the wax is removed from the surfaces of the elements by vaporization or thermal decomposition, and at the same time, electrodes are formed. In this case, it is also possible to remove the wax by heating at 400 to 600° C., moving the elements A2 from the supporting member into another container, and applying a heat treatment at 650 to 800° C. to form electrodes.

By the above-mentioned heat treatment, a diffusion layer or alloy layer of the conductive agent contained in the conductive paste is formed on the surfaces of the first semiconductors, and at the same time, with molten glass frit acting as a binder, a strong electrode is formed. Due to the action of the alloy layer or diffusion layer, the contact resistance at the joint between the first semiconductor and the electrode becomes small.

Figure 26:
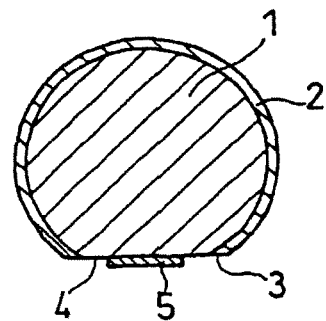
FIG. 26 is a longitudinal sectional view of a photovoltaic element A3 obtained by step (c) of Embodiment 4 of the present invention.

FIG. 26 shows a cross-section of the element A3 with an electrode 5 formed on the exposed part 4 of the first semiconductor of the element A2 of FIG. 23. The electrode 5 can be formed by applying a conductive paste with a dispenser to a circular central part of the exposed part 4 with a diameter of approximately 300 µM at a speed of 2 dots/second, and applying a heat treatment. The conductive paste may also be applied by screen printing, offset printing or ink jet. The shape of the electrode may be oval, polygonal, ring-shaped, and in the form of an assembly of dots, as well as being circular.

As will be detailed later in the step (f) of this embodiment, there is a method of setting the element A3 in the predetermined position of the recess of the support by making the electrode or the vicinity thereof more magnetic than other parts and utilizing the magnetism. Hereinafter, the element to which this method is applied is described.

The magnetic electrode can be formed by using a glass frit-type conductive paste additionally containing a ferromagnetic substance powder such as Ni or Fe. By the same method as that of the electrode of the element A3 of FIG. 26, the electrode of the same shape can be obtained. The vicinity of the electrode can be strongly magnetized by forming a magnetic substance layer containing a ferromagnetic substance around the electrode. The magnetic substance layer can be formed by applying a paste for forming magnetic substance layer over or around the electrode with a dispenser or the like and applying a heat-treatment. The paste for forming magnetic substance layer is, for example, a dispersion of a conductive ferromagnetic substance powder such as Ni or Fe and, if necessary, a conductive agent such as Ag in an organic solvent, a thermosetting resin, or the like.

Figure 27:
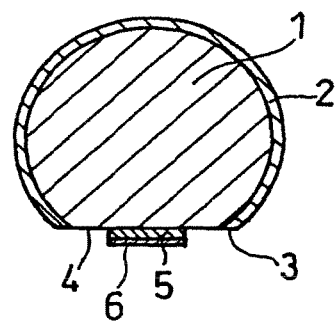
FIG. 27 are longitudinal sectional views showing other exemplary photovoltaic elements A3 obtained by the above step.
Figure 27:
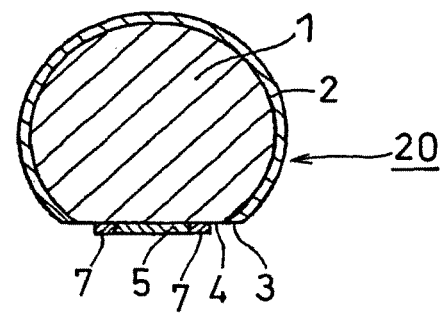

FIG. 27(1) illustrates a cross-section of the element A3 with a magnetic substance layer 6 formed on the electrode 5 of the element of FIG. 26, and FIG. 27(2) illustrates a section of the element A3 with a magnetic substance layer 7 formed around the electrode 5.

4-4) Steps (d) and (e)

A support in which the photovoltaic elements A3 are to be mounted is prepared in the step (d), and a conductive adhesive is applied to the peripheries of the apertures of the support in the step (e). These steps can be performed by the same methods as those of 1-2) and 1-3) of Embodiment 1.

4-5) Step (f)

In this step, the photovoltaic elements A3 are mounted in a specific orientation to the support such that their second semiconductor layers are in contact with the edges of the apertures of the support to which the conductive adhesive was applied in the previous step (e). As a result, a structure B2 is fabricated in which the second semiconductor layers of the elements A3 are electrically and physically connected to the support with the conductive adhesive.

Figure 28A:
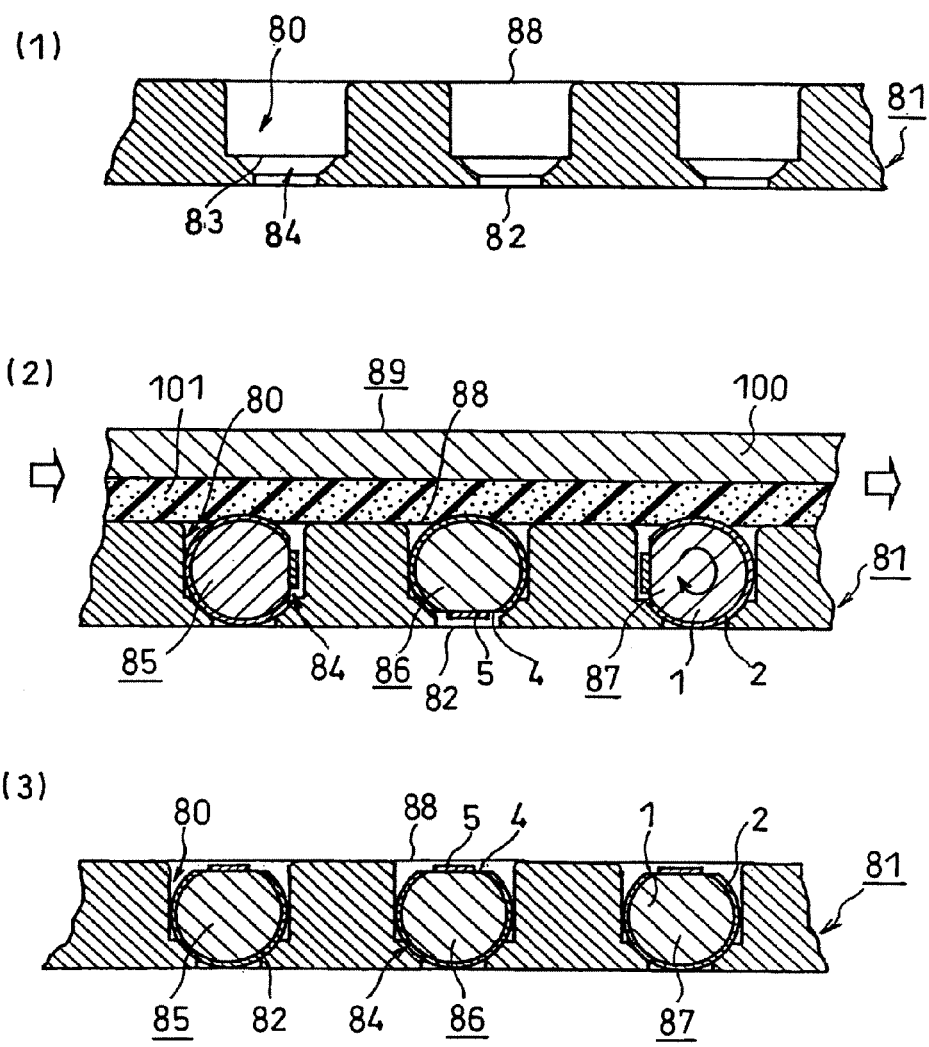
FIGS. 28A and 28B are longitudinal sectional views showing the step of disposing the photovoltaic elements A3 in the support with the conductive-adhesive applied thereto in step (f) of Embodiment 4 of the present invention.
Figure 28B:
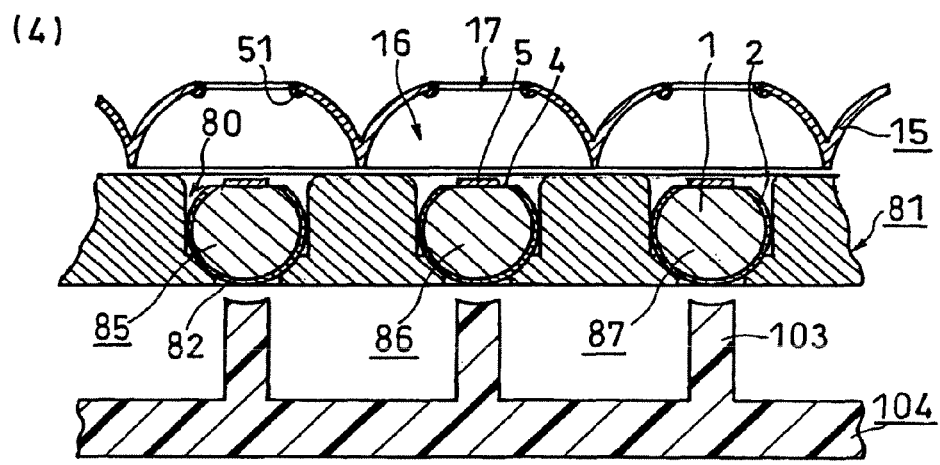
Figure 28B:
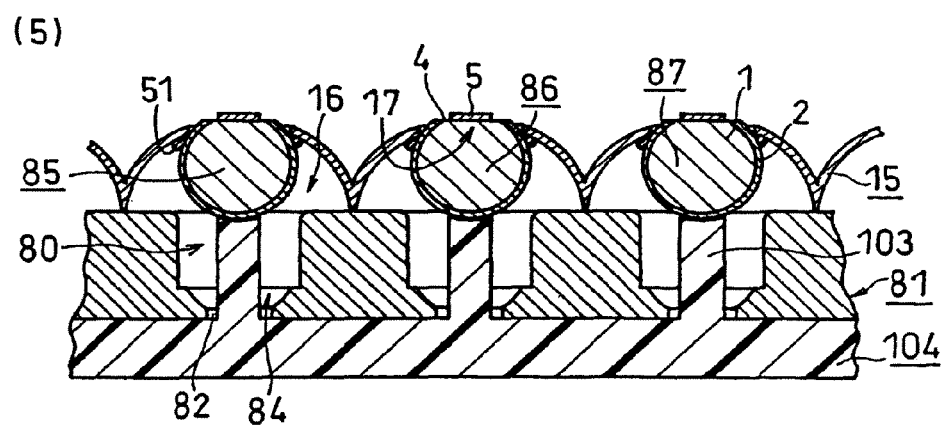

Referring now to FIG. 28A and FIG. 28B, a first method for fabricating the structure B2 is described. First, as illustrated in FIG. 28A(1), a temporary substrate 81 is prepared which has a large number of cavities 80 for temporarily receiving elements in the same pattern as that of the recesses 16 of the support 15 of FIG. 3. The diameter of an upper opening 88 of each cavity 80 is slightly larger than the diameter of the element of FIG. 23. The bottom of each cavity 80 has a through-hole 84. The through-hole 84 has an upper opening 83, which is slightly larger than the opening 3 of the second semiconductor, and a lower opening 82, which is smaller than the opening 3. Subsequently, a large number of the elements of FIG. 26 are rolled on the temporary substrate 81, so that elements 85, 86, and 87 are housed in the cavities 80 in random orientations.

Then, as illustrated in FIG. 28A(2), a sliding plate 89, consisting of a sponge sheet 101 bonded to a resin flat plate 100, is moved gently from left to right so as to lightly brush the upper face of the temporary substrate 81 with the elements temporarily disposed therein. As a result, the parts of the elements 85, 86, and 87 protruding from the cavities 80 are rubbed by the sponge sheet 101, so that the elements 85, 86, and 87 slide and rotate inside the cavities 80 in the direction shown by the arrow. For example, the orientation of the element 85 changes to that of the element 86 and then the element 87.

If the operation of moving the sliding plate 89 from left to right is continued, each element rotates until the electrode 5 is positioned at the center of the upper opening 88 of the cavity 80. At this time, since no part of the element protrudes from the cavity 80 and no external force is applied to the element by the movement of the sliding plate 89, the rotation of the element stops. By repeating the operation of moving the sliding plate 89 several times, all the elements 85, 86, and 87 are eventually housed in the cavities 80 with their electrodes facing upward, as illustrated in FIG. 28A(3).

Subsequently, as illustrated in FIG. 28B(4), the support 15 of FIG. 7(5) with the conductive paste 51 applied thereto, and the temporary substrate 81 of FIG. 28A(3) with the elements housed in the controlled orientation, are laminated such that the centers of the recesses 16 and the corresponding cavities 80 of the temporary substrate are opposed to one another. On the backside of the temporary substrate 81, there is provided a plate 104 that has projections 103, smaller than the openings 82, in the same pattern as that of the through-holes 84. By pushing up the plate 104 to insert the projections 103 into the cavities 80 via the through-holes 84, the elements 85, 86, and 87 are pushed into the recesses 16. As a result, as illustrated in FIG. 28B(5), the elements 85, 86, and 87 are set in the predetermined positions of the support in the specific orientation, and at the same time, the elements are temporarily fixed to the support with their second semiconductor layers 2 bonded to the edges or peripheries of the apertures 17 with the conductive adhesive 51. This step is performed before the conductive adhesive applied to the support becomes solidified.

Thereafter, by applying a heat treatment to the conductive adhesive applied to the support for solidification, the properly positioned elements are fixed with their orientation maintained, and their second semiconductor layers are electrically connected to the second conductor layer. This produces a structure B2. When a resin-type conductive paste is used as the conductive adhesive, it is subjected to a heat treatment at 100 to 150° C. for 10 to 20 minutes. When a low-temperature glass frit-type conductive paste is used, it is dried at approximately 100 to 150° C. and then subjected to a heat treatment at approximately 500° C. for 10 to 20 minutes.

Next, a second method for fabricating the structure B2 is described. This method includes the step of applying a magnetic field to elements A3 whose electrodes or vicinities thereof are more magnetic than other parts from a predetermined direction to align the electrodes of the elements A3 in a predetermined orientation. In a preferable mode of this positioning method, first, elements A3 are placed in predetermined positions of a temporary placement member, and a magnetic field is applied to the elements A3 from a predetermined direction to align the electrodes of the elements A3 in a predetermined orientation. Subsequently, by transferring the elements A3 to the support while maintaining this alignment, the elements A3 are positioned such that the exposed part of each first semiconductor with the electrode formed thereon protrudes through the backside of the support from the aperture of the recess.

Figure 29:
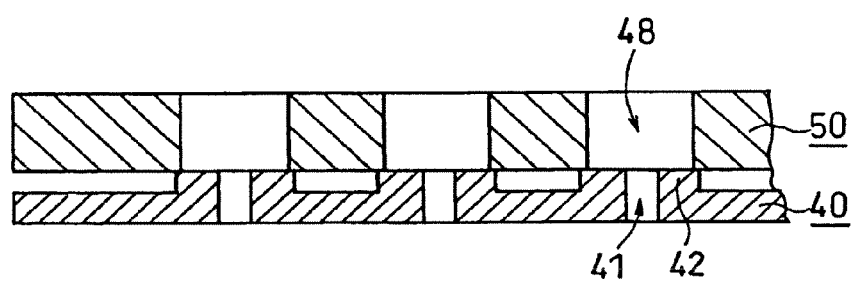
FIG. 29 are longitudinal sectional views showing the first step for disposing the photovoltaic elements A3 in the support with the conductive adhesive applied thereto by another method of the above step.
Figure 29:
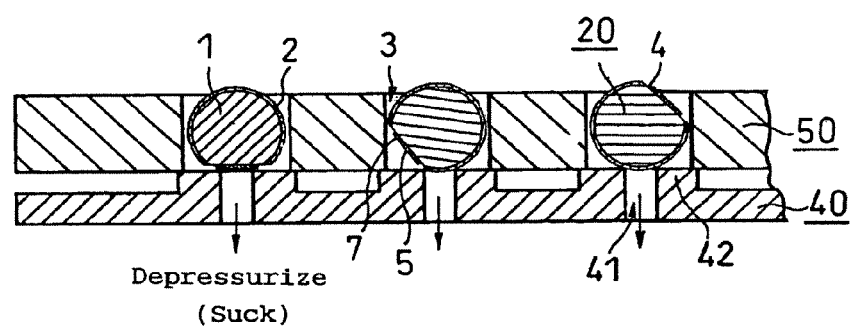

This positioning method is specifically described with reference to FIGS. 29 to 31. First, by the step as shown by FIG. 29, the elements of FIG. 27(2) are temporarily placed in random orientations in a temporary placement member consisting of a suction/detachment filter 40 and an alignment filter 50. The suction/detachment filter 40 has a large number of projections 42 in the same pattern as that of the recesses of the support. In the middle of each projection 42 is formed a suction/detachment hole 41, which is slightly smaller than the exposed part 4 of the first semiconductor of each element 20. The alignment filter 50 has a large number of temporary placement holes 48, which are slightly larger than the elements 20 and slightly smaller than the projections 42, in the same pattern as that of the suction/detachment holes 41.

As illustrated in FIG. 29(1), the alignment filter 50 is laminated on the suction/detachment filter 40 such that the centers of the suction/detachment holes 41 and the corresponding temporary placement holes 48 align. Then, while applying vibrations thereto and reducing the pressure of air on the side of the suction/detachment filter 40, a large number of the elements 20 are rolled on the alignment filter 50. As a result, the elements 20 are sucked into the suction/detachment holes 41 and the elements 20 are temporarily placed in all the temporary placement holes 48 in random orientations, as illustrated in FIG. 29(2). The excessive elements 20 are removed by tilting the temporary placement member.

Figure 30:
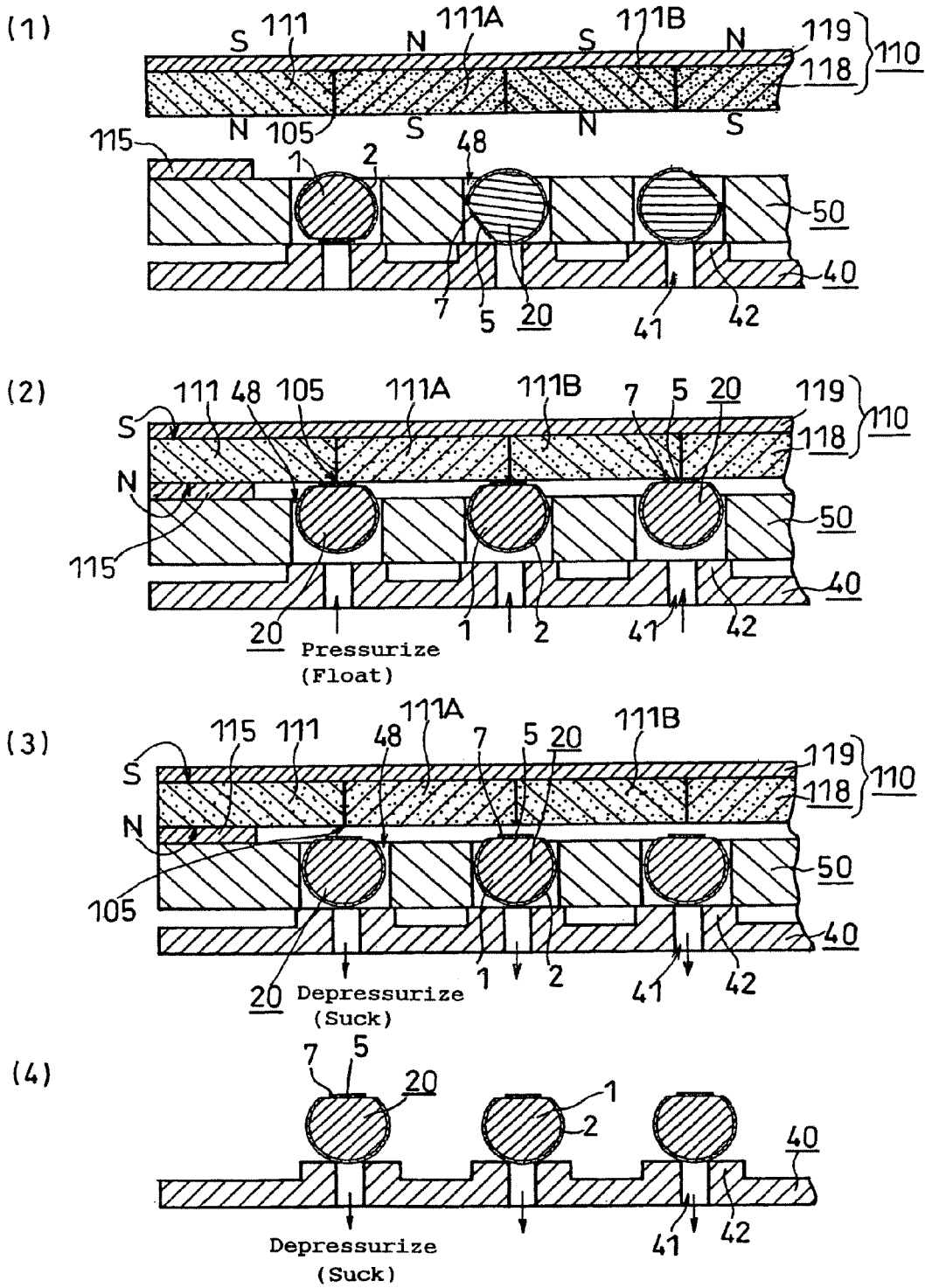
FIG. 30 are longitudinal sectional views showing the intermediate step for the above step.

Referring now to FIG. 30, the step of aligning the elements 20 in a specific orientation by applying a magnetic field to the elements 20 temporarily placed in the temporary placement member from a predetermined direction is described. As a means for applying a magnetic field to the elements 20, a magnet assembly 118 in the form of a plate is used. The magnet assembly 118 consists of a plurality of rectangular magnets 111 that are joined in parallel. A magnetic field is applied to the elements 20 from the plane perpendicular to the joint between adjacent magnets 111A and 111B of the magnet assembly 118, so that the magnetic substance layers of the elements 20 are attracted and aligned in a predetermined orientation by the attractive force from magnet joints 105. The use of an assembly of magnets 111 allows the magnet joints 105 to produce a stronger magnetic force than the use of magnets that are separated from one another.

First, a composite magnet 110 is prepared which includes the magnet assembly 118 consisting of the plurality of narrow magnets 111 with a rectangular cross-section. The magnet assembly is structured such that magnetic poles of different polarities are alternately arranged on the plane perpendicular to the joint of the magnets 111A and 111B. The composite magnet 110 comprises a back yoke plate 119 that is integrally joined to the magnet assembly by the attractive force of the magnet assembly. Next, a spacer 115 is placed on the edge of the temporary placement member of FIG. 29(2) with the elements 20 temporarily placed therein, and the magnetic-force-generating plane of the composite magnet 110 is brought close to the temporary placement member, as illustrated in FIG. 30(1). At this time, the magnet joints 105 of the magnetic-force-generating plane are opposed to the centers of the temporary placement holes 48 of the alignment filter 50.

Subsequently, by lowering the composite magnet 110 vertically and placing it on the spacer 115, a magnetic field is applied to the elements 20 so that attractive force is applied to the centers of the elements 20. At the same time, by pressurizing the air on the backside of the suction/detachment filter 40, buoyancy is given to the elements 20 from the suction/detachment holes 41. This buoyancy allows the elements 20 to float in the holes 48, creating a moment at which the magnetic substance layer 7 is positioned upward in each hole 48. At this moment, due to attractive force, the magnetic substance layer 7 is drawn to the magnet joint 105. As a result, as illustrated in FIG. 30(2), the orientations of all the elements 20 are controlled such that the exposed parts of the first semiconductors with the electrodes 5 and magnetic substance layers 7 formed thereon face upward.

Thereafter, by reducing the pressure of air on the backside of the suction/detachment filter 40, the elements 20 are detached from the composite magnet 110 and sucked into the suction/detachment holes 41 while their orientations are maintained. As a result, as illustrated in FIG. 30(3), all the elements 20 are aligned in the predetermined orientation in the suction/detachment holes 41 of the suction/detachment filter. Then, while maintaining the reduced pressure, the composite magnet 110 is removed and the alignment filter 50 is lifted upward, so that the alignment filter 50 is separated from the suction/detachment filter 40 with the elements 20 sucked thereto. FIG. 30(4) illustrates all the elements 20 disposed in the predetermined positions of the suction/detachment filter 40 in the predetermined orientation.

Next, by transferring the elements 20 disposed in the temporary placement member to the support while maintaining their state, the elements 20 are positioned in the support. FIG. 31 illustrates this step. First, the support 15 of FIG. 7(5) with the conductive adhesive applied to the peripheries of the apertures 17 is prepared. Then, as illustrated in FIG. 31(1), the support 15 is placed near the suction/detachment filter 40 of FIG. 30(4) with the elements 20 sucked thereto such that the centers of the recesses 16 are opposed to the centers of the corresponding holes 41 of the suction/detachment filter 40.

Subsequently, the support 15 is lowered and placed over the suction/detachment filter 40. As a result, as illustrated in FIG. 31(2), the periphery of opening of the second semiconductor layer 2 of each element 20 is fitted to each aperture 17, and the opening of the second semiconductor layer 2, the exposed part 4 of the first semiconductor, and the electrode 5 and the magnetic substance layer 7 protrude through the backside of the support 15. At this time, the periphery of opening of the second semiconductor layer 2 adheres to the conductive adhesive 51 applied to the periphery of the aperture 17 of each recess, so that the elements 20 are temporarily fixed in the predetermined orientation.

Figure 31:
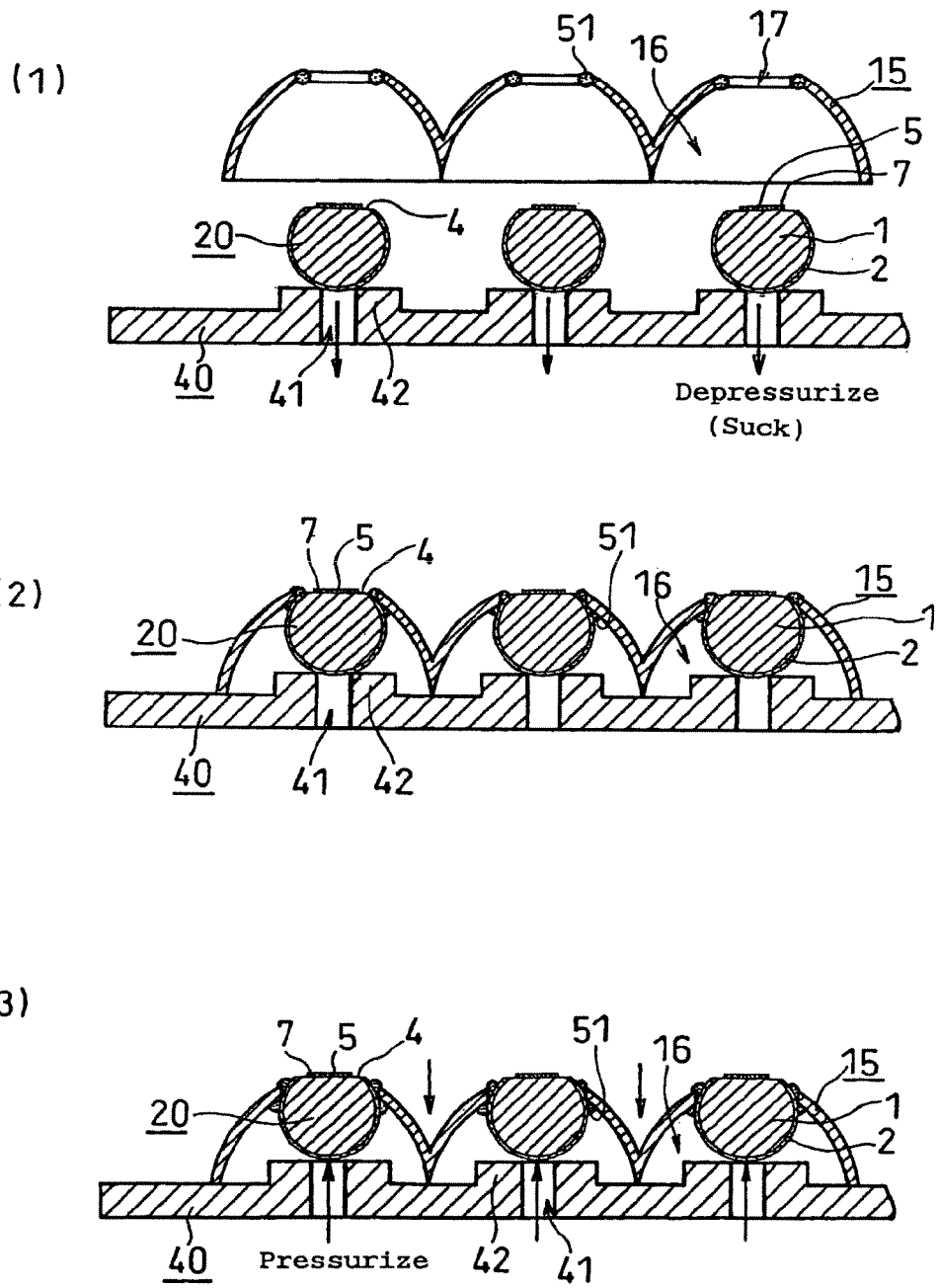
FIG. 31 are longitudinal sectional views showing the last step for the above step.

In order to make this temporary fixing more reliable, the step as illustrated in FIG. 31(3) may be performed. Specifically, the support 15 is fixed while its position is maintained, and the air on the backside of the suction/detachment filter 40 is pressurized to push up the elements 20 from the holes 41. By applying a heat treatment thereto to solidify the conductive adhesive 51, the elements 20 are fixed and the support 15 is electrically connected to the second semiconductor layers 2. The conductive adhesive and the heat treatment conditions thereof may be the same as those in the first method of fabricating the structure B2.

4-6) Steps (g), (h), and (i)

The step (g) is performed to form an electrical insulator layer on the backside of the support of the structure B2 prepared in the previous step (f). The step (h) is then performed to form through-holes in the electrical insulator layer in order to expose the electrodes of the photovoltaic elements A3. Thereafter, the step (i) is performed to form a first conductor layer that electrically interconnects the electrodes with the through-holes as conductive paths.

Figure 32:
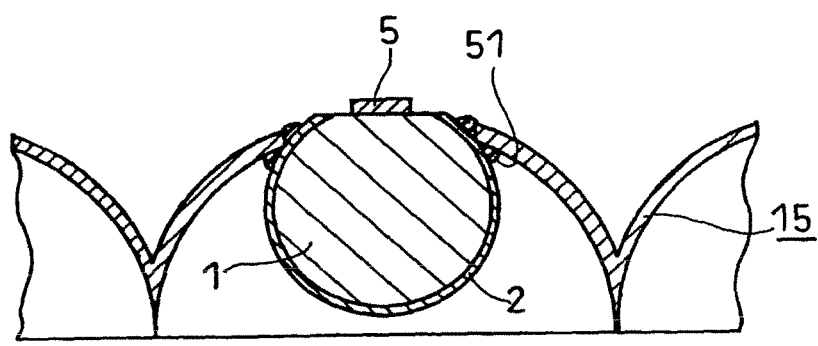
FIG. 32 are longitudinal sectional views showing the steps of forming an electrical insulator layer and a first conductor layer on the backside of a structure 82 in steps (g), (h), and (i) of Embodiment 4 of the present invention.
Figure 32:
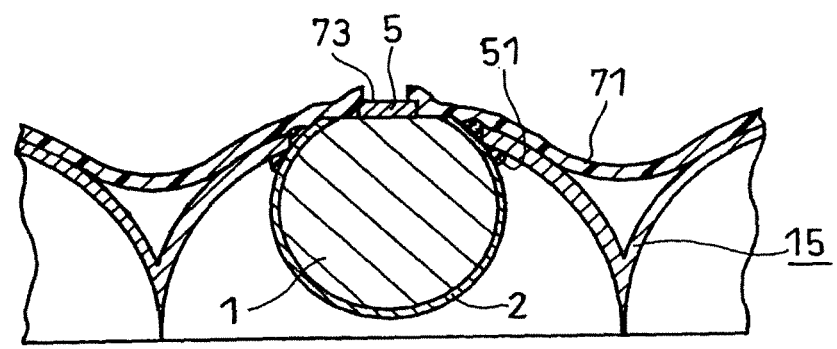
Figure 32:
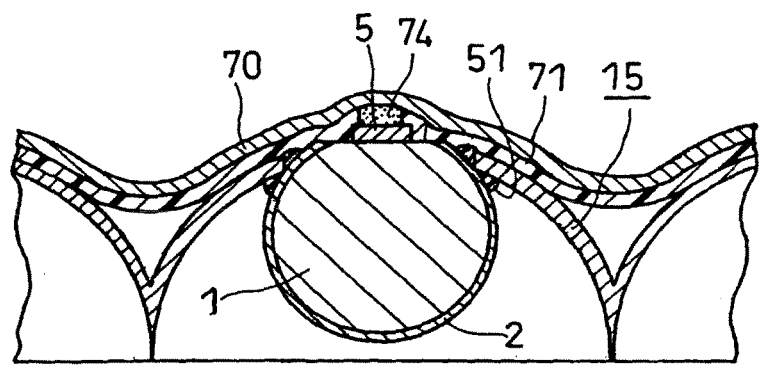

These steps can be carried out by the same methods as those as described in 2-3) and 2-4) of Embodiment 2. FIG. 32 illustrates a representative method thereof. An electrical insulator layer 71 is bonded to the backside of the support 15 of the structure B2 of FIG. 32(1). As illustrated in FIG. 32(2), a through-hole 73 is then made in the electrical insulator layer 71 to expose the electrode 5 therein. Subsequently, a conductive paste 74 is filled into the through-hole 73, and as illustrated in FIG. 32(3), a metal sheet 70 is connected to the electrical insulator layer 71, to form a first conductor layer.

Figure 33:
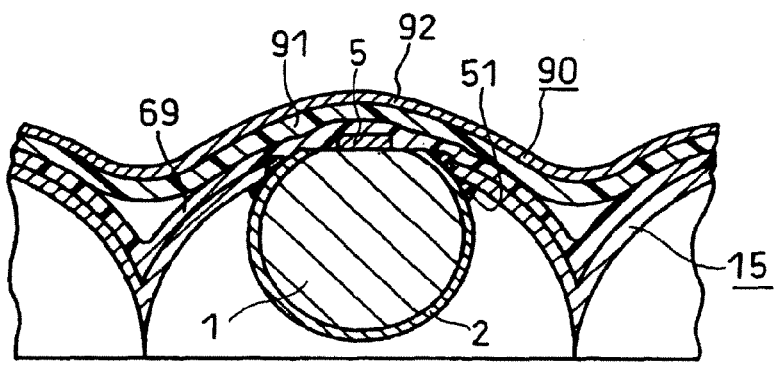
FIG. 33 are longitudinal sectional views showing the steps of forming an electrical insulator layer and a first conductor layer according to another method of the steps (g), (h), and (i) of Embodiment 4 of the present invention.
Figure 33:
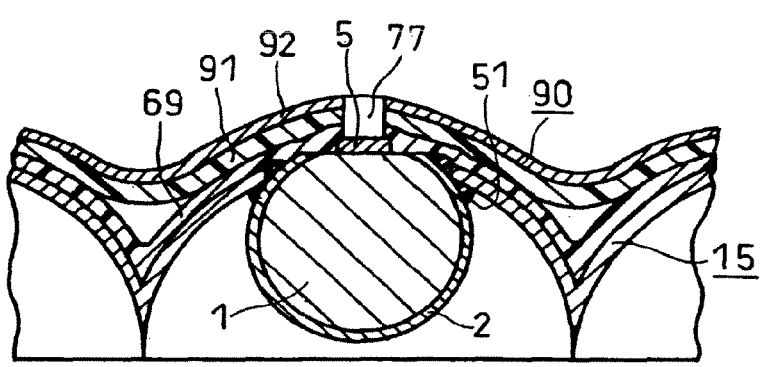
Figure 33:
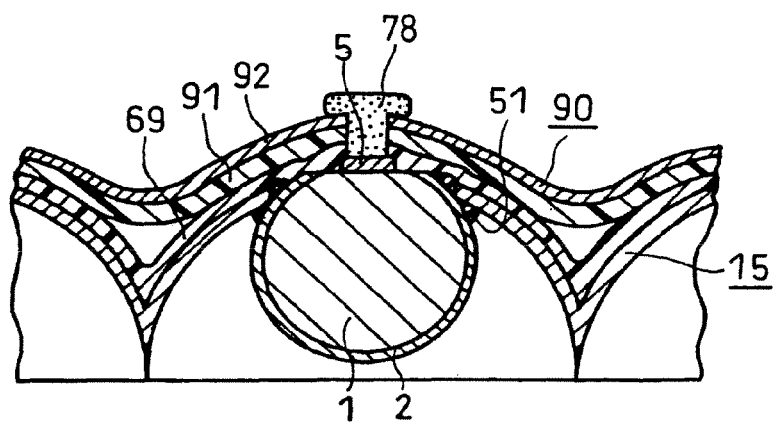

Further, the methods of the steps (g), (h), and (i) previously described as modifications in Embodiment 2 may also be performed in this embodiment 4. FIG. 33 illustrates a specific example of this method. As illustrated in FIG. 33(1), an electrical insulator layer 91 and a metal sheet 92 are bonded to the backside of the support 15 of the structure B2 with an adhesive layer 69 interposed therebetween. Then, as illustrated in FIG. 33(2), a through-hole 77 is made in the electrical insulator layer 91 and the metal sheet 92. Thereafter, as illustrated in FIG. 33(3), a conductive paste 78 is filled into the through-hole 77, to form a first conductor layer.

Embodiment 5

This embodiment is directed to a production method in which steps (a), (b), and (d) are performed and then steps (e), (f), (g), (h), (c), and (i) are performed in this order. In this embodiment, photovoltaic elements A2, each having an exposed part of the first semiconductor but having no electrode, are mounted in a support to fabricate a structure B3, and through this step, a photovoltaic device is produced.

5-1) Steps (a) and (b)

The step (a) is performed to prepare a plurality of photovoltaic elements A1, and the step (b) is then performed to covert these elements A1 to elements A2. These steps are carried out by the same methods as those as described in 4-1) and 4-2) of Embodiment 4.

5-2) Steps (d) and step (e)

The step (d) is performed to prepare a support in which the photovoltaic elements A2 are to be disposed, and the step (e) is then performed to apply a conductive adhesive to the peripheries of the apertures of the support. These steps are carried out by the same methods as those as described in 1-2) and 1-3) of Embodiment 1.

5-3) Step (f)

In this step, the photovoltaic elements A2 are mounted to the support in a specific orientation such that their second semiconductor layers are in contact with the edges of the apertures of the support to which the conductive adhesive was applied in the previous step (e). As a result, a structure B3 is fabricated in which the second semiconductor layers are electrically and physically connected to the support.

Figure 34:
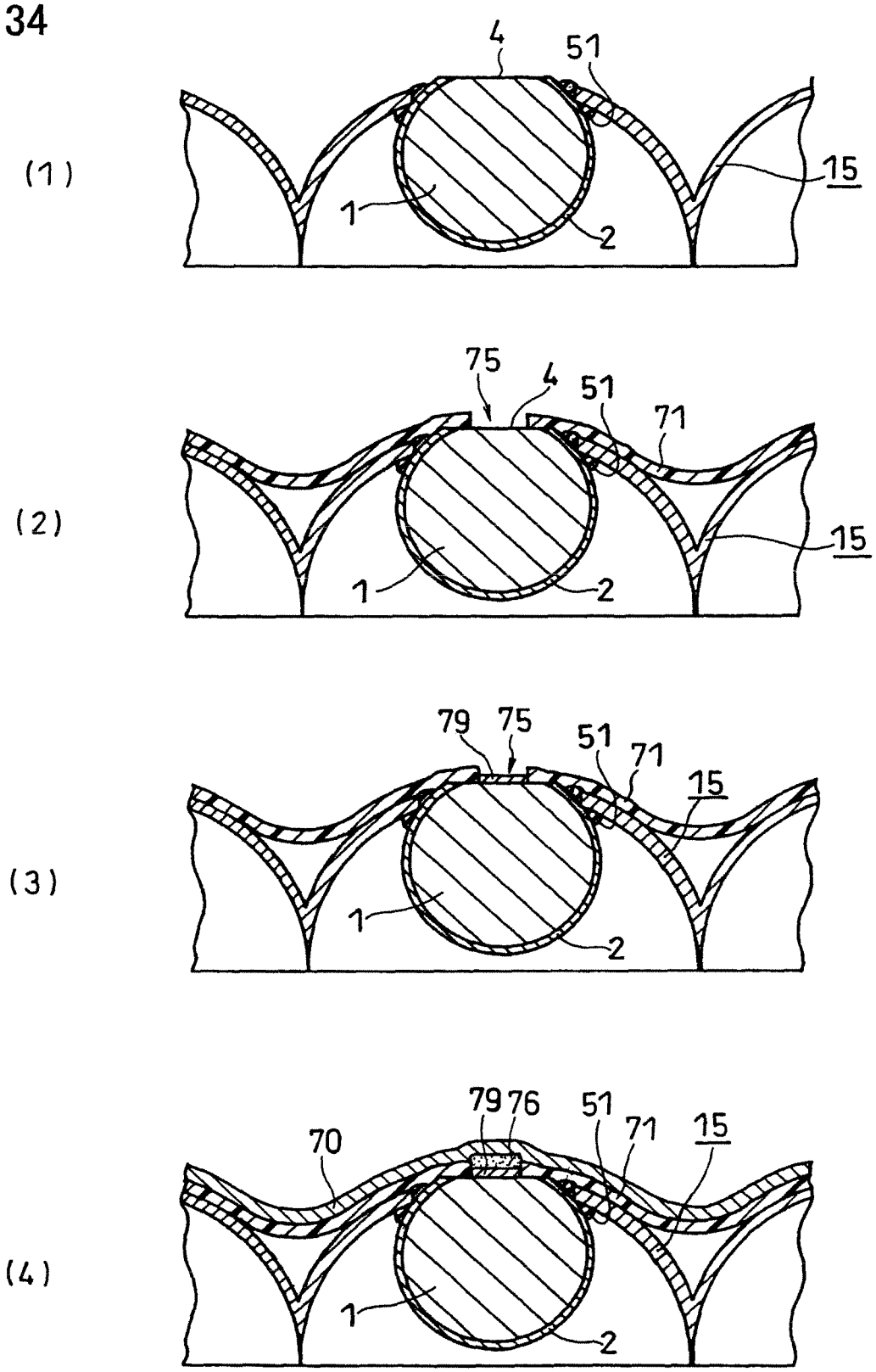
FIG. 34 are longitudinal sectional views showing the steps from the step of disposing the photovoltaic element A2 in the support in step (f) to the step of forming a first conductor layer in step (i) of Embodiment 5 of the present invention.

In this embodiment, the elements A2 having no electrode are mounted in the support, whereas in Embodiment 4, the elements A3 with electrodes are disposed in the support. Although there is such a difference therebetween, in fact the elements A2 and the elements A3 have substantially the same shape and dimensions, since the electrode is a thin layer with a thickness of approximately 5 to 20 μm. Therefore, this step can be performed in accordance with the first fabrication method of the structure B2 as described in 4-5) of Embodiment 4. FIG. 34(1) illustrates the structure 83 obtained in this step by mounting the elements A2 of FIG. 23 in the support 15 of FIG. 7(5).

5-4) Steps (g) and (h)

The step (g) is performed to form an electrical insulator layer 71 on the backside of the support 15 of the structure B3 fabricated in the previous step (f), and the step (h) is then performed to make through-holes 75 in the electrical insulator layer 71. These steps can be carried out by the same methods as those as described in 1-6) and 1-7) of Embodiment 1. FIG. 34(2) illustrates the through-hole 75 in the electrical insulator layer 71 on the backside of the support 15.

5-5) Steps (c) and (i)

The step (c) is performed to form an electrode on the exposed surfaces of the first semiconductors inside the through-holes 75 made in the previous step (h), whereby the photovoltaic elements A2 are converted to elements A3 with electrodes. Subsequently, the step (i) is performed to form a first conductor layer that electrically interconnects the electrodes of the elements A3, with the through-holes 75 as conductive paths.

These steps can be carried out by the same methods as those as described in 1-8) and 1-9) of Embodiment 1. For example, as illustrated in FIG. 34(3), an electrode 79 is formed on the surface of the first semiconductor 4 inside the through-hole of the electrical insulator layer 71. Then, as illustrated in FIG. 34(4), a conductive adhesive 76 is applied to the electrode 79 inside the through-hole 75, and a metal sheet 70 is bonded to the electrical insulator layer 71, to form a first conductor layer.

The above-described production methods of the present invention can provide photovoltaic devices with high quality and high reliability, where spherical photovoltaic elements are firmly fixed to the predetermined positions inside the recesses of a support and the first semiconductors and the second semiconductor layers of all the elements fixed to the support are electrically connected to a first conductor layer and a second conductor layer, respectively, in a reliable manner.

Of the embodiments of the above-described production methods of the present invention, in Embodiments 1 to 3, the photovoltaic elements A1 are mounted in the support before the exposed part of the first semiconductor and the electrode are formed. Thus, in the step (f), the elements can be disposed in the recesses of the support in any orientation. On the other hand, in Embodiment 5 or 4, in disposing the elements A2 with the exposed part of the first semiconductor or the elements A3 with the electrode in the support, it is necessary to control the orientation of the elements to a particular orientation. Therefore, Embodiments 1 to 3 have an advantage over Embodiments 5 and 4 in that the step (f) is simplified. However, Embodiments 4 and 5 have an advantage in terms of quality control, i.e., the characteristics of the elements can be checked before they are mounted in the support.

Also, in the step (b), Embodiments 1 and 2 have an advantage in that the second semiconductor layer can be removed without being obstructed by the electrical insulator layer, unlike Embodiment 3 where the second semiconductor layer inside the through-hole of the electrical insulator layer is removed. On the other hand, in Embodiment 3, since the support is masked with the electrical insulator layer, the conditions for controlling the etching are eased.

Also, in the step (c), in Embodiment 2, the electrode is formed before the electrical insulator layer is formed. Thus, when the applied conductive paste is subjected to a heat treatment by laser irradiation, decomposition products such as carbon may be scattered, thereby coming into contact with the support and causing a short-circuit. On the other hand, in Embodiments 1 and 3, since the electrode is formed on the first semiconductor inside the through-hole of the electrical insulator layer, the decomposition products remain inside the through-hole and are unlikely to cause a short-circuit. Accordingly, in order to prevent the short-circuit, it is necessary in Embodiment 2 to control, for example, the laser irradiation conditions and the application state of the conductive paste more carefully than in Embodiments 1 and 3.

Further, in Embodiment 4, since the characteristics of the elements with the electrode formed thereon can be checked in advance, the elements can be selected more reliably than in Embodiment 5. However, in Embodiment 5, since the electrode is formed on the elements mounted in the support in the step (c), there is an advantage in that complicated steps are not necessary in comparison with Embodiment 4 where the electrode is formed on a large number of the elements that are fixed in the controlled orientation.

As described above, sine the respective embodiments have their own unique characteristics, they can be selected as appropriate depending on the individual production conditions of photovoltaic devices.

Figure 35:
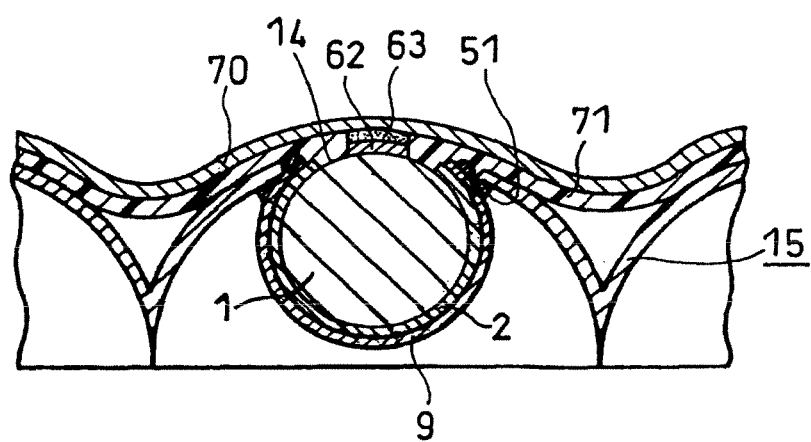
FIG. 35 is a longitudinal sectional view showing an exemplary photovoltaic device according to the present invention.

FIG. 35 illustrates an exemplary photovoltaic device according to the present invention. The photovoltaic device of FIG. 35 is produced in accordance with the first embodiment of the production method of the present invention. Since this device has the same configuration as that of FIG. 16 except that the second semiconductor layer has, on the surface, a conductive anti-reflection coating 9 of 50 to 100 nm in thickness comprising tin oxide doped with at least one of fluorine and antimony, the explanation of the configuration is omitted.

The photovoltaic device according to the present invention can be rationally produced with high quality by the respective embodiments of the production methods of the present invention.

The photovoltaic element used in the photovoltaic device of the present invention has the conductive anti-reflection coating on the surface of the second semiconductor layer. Thus, the second semiconductor layer can be connected to the second conductor layer of the support, with the anti-reflection coating and the conductive adhesive interposed therein, at a low resistance and without a high-temperature heat treatment. Since there is no need to expose the second conductor layer to high temperatures, even if the second conductor layer has a silver thin layer that is suited as the reflecting mirror, there is no fear that the silver layer may be discolored or damaged by heat treatment to cause reflectivity deterioration.

In order to electrically connect a second semiconductor layer having no conductive anti-reflection coating to a second conductor layer at a low resistance, it is preferred to use a glass frit-type conductive paste, rather than a resin-type conductive paste, as the conductive adhesive and apply a heat treatment at approximately 500° C. However, such a high-temperature heat treatment causes damage such as discoloration to the silver, thereby lowering the function as the reflecting mirror. The present inventors have experimentally found that, in the case of an element with a conductive anti-reflection coating, by using a resin-type conductive paste and applying a heat treatment at 100 to 200° C., or by using a conductive paste that includes a low melting-point glass as a binder and applying a heat treatment at 200 to 400° C., the second semiconductor layer can be electrically connected to the second conductor layer at a low resistance without discoloring the silver. Although the reason is not yet clear, it is probably because the anti-reflection coating and the semiconductor layer, and the anti-reflection coating and the conductive paste, are connected at a low electrical resistance, with the anti-reflection coating acting as the electrode for the second semiconductor.

In the photovoltaic device according to the present invention, the anti-reflection coating serves to increase the amount of incident light absorbed by the photovoltaic element and, moreover, the function of the inner face of the recess of the support as the reflecting mirror is exhibited effectively. As a result, high outputs can be obtained.

The photovoltaic device as described in the foregoing embodiments constitutes a unit of a solar cell module. This unit is composed of a support of, for example, 170 mm×54 mm and 1800 elements A3 with a diameter of approximately 1 mm mounted in the support, and has a rated output of approximately 1 W.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A method of producing a photovoltaic device comprising:
   a plurality of substantially spherical photovoltaic elements, each comprising: a spherical first semiconductor; a second semiconductor layer covering the surface of the first semiconductor, the second semiconductor layer having an opening through which a part of the first semiconductor is exposed; and an electrode formed on the exposed part of the first semiconductor;

a support having a plurality of adjacent recesses for receiving said photovoltaic elements one by one on a frontside thereof, each of the recesses having an aperture in a bottom thereof, the aperture being smaller than each of said photovoltaic elements, said support serving as a second conductor layer that is electrically connected to the second semiconductor layers of the respective photovoltaic elements disposed in said recesses, each of said photovoltaic elements being fixed to each of said recesses with a conductive adhesive such that the second semiconductor layer thereof is in contact with an edge of said aperture of the recess and that the exposed part of the first semiconductor protrudes through a backside of the support; and an electrical insulator layer and a first conductor layer that are provided on the backside of the support such that said electrical insulator layer insulates the support from the first conductor layer, said electrical insulator layer having a plurality of through-holes, said first conductor layer being electrically connected to said electrodes of said photovoltaic elements via the through-holes of said electrical insulator layer, said method comprising steps of:

(a) providing a plurality of substantially spherical photovoltaic elements A1, each comprising a spherical first semiconductor and a second semiconductor layer covering the whole surface of the first semiconductor;

(b) forming an opening in the second semiconductor layer of each of said photovoltaic elements A1 to expose a part of the first semiconductor, to prepare photovoltaic elements A2;

(c) forming an electrode on the exposed part of the first semiconductor of each of said photovoltaic elements A2, to prepare photovoltaic elements A3;

(d) providing said support;

(e) applying a conductive adhesive to a periphery of each of the apertures of said support;

(f) disposing said photovoltaic elements A1, A2 or A3 in the recesses of said support such that the second semiconductor layers are in contact with the edges of the apertures of said support, and connecting said second semiconductor layers to said support electrically and physically with said conductive adhesive;

(g) forming an electrical insulator layer on the backside of said support;

(h) forming through-holes in said electrical insulator layer, said through-holes serving as conductive paths for interconnecting the electrodes of said photovoltaic elements A3; and (i) forming a first conductor layer on said electrical insulator layer, said first conductor layer electrically interconnecting the electrodes that are exposed inside said through-holes, wherein said steps (a) and (d) are performed, and then said steps (e), (f), (b), (c), (g), (h), and (i) are performed in this order.

2. The method of producing a photovoltaic device in accordance with claim 1, wherein said photovoltaic elements are composed mainly of silicon.

3. The method of producing a photovoltaic device in accordance with claim 1, wherein said step (a) further comprises the step of forming a conductive anti-reflection coating on the surface of each of said second semiconductor layers, and a part of said anti-reflection coating is removed together with the second semiconductor layer in said step (b) to form said opening.

4. The method of producing a photovoltaic device in accordance with claim 3, wherein said anti-reflection coating comprises tin oxide doped with at least one of fluorine and antimony and has a thickness of 50 to 100 nm.

5. The method of producing a photovoltaic device in accordance with claim 1, wherein said step (e) comprises the steps of:

applying said conductive adhesive onto tips of pins that are slightly larger than the apertures of said support; and transferring said conductive adhesive applied to said tips onto the peripheries of said apertures, by inserting said tips into the recesses of said support from the frontside of said support and bringing said tips into contact with the peripheries of said apertures such that the centers of said tips and said apertures align.

6. The method of producing a photovoltaic device in accordance with claim 1, wherein said step (b) comprises removing a part of the second semiconductor layer of each of said photovoltaic elements A1 by etching, to form said opening.

7. The method of producing a photovoltaic device in accordance with claim 6, wherein said step (b) comprises, prior to said etching step, the step of preliminarily removing the part of the second semiconductor layer to be etched by brushing or sandblasting.

8. The method of producing a photovoltaic device in accordance with claim 1, wherein said step (c) comprises the steps of:

applying a conductive paste to the exposed part of the first semiconductor of each of said photovoltaic elements A2; and applying a heat treatment to the applied conductive paste by laser irradiation, to form said electrode.

9. The method of producing a photovoltaic device in accordance with claim 1, wherein said step (g) comprises the step of bonding a semicured electrical insulator layer, which comprises an insulating sheet composed mainly of a thermosetting resin, to the backside of said support under pressure, and said step (i) comprises the steps of:

bonding a conductive metal sheet to the semicured electrical insulator layer under pressure; and curing the semicured electrical insulator layer by a heat treatment, to fix said conductive metal sheet to the electrical insulator layer.

10. The method of producing a photovoltaic device in accordance with claim 1, wherein said steps (g) to (i) comprise the steps of:

bonding an electrical insulator layer and a conductive metal sheet to the backside of said support such that the electrical insulator layer separates said conductive metal sheet from said support;

forming through-holes in the electrical insulator layer and the conductive metal sheet bonded to said support to expose the electrodes of said photovoltaic elements A3 inside said through-holes; and filling a conductive paste into said through-holes to electrically connect said electrodes to said conductive metal sheet, in order to form said first conductor layer.

11. The method of producing a photovoltaic device in accordance with claim 10, wherein said step of bonding the electrical insulator layer and the conductive metal sheet to the backside of said support comprises the step of bonding a composite sheet, which includes a conductive metal sheet and an electrical insulator layer laminated to one side of the conductive metal sheet, to the backside of the support such that the electrical insulator layer faces the support.

12. The method of producing a photovoltaic device in accordance with claim 11, wherein said step of bonding the composite sheet comprises the steps of:
   applying an electrically insulating adhesive to the backside of said support, to form an adhesive layer; and
   bonding the electrical insulator layer of said composite sheet to said adhesive layer of the support.

13. The method of producing a photovoltaic device in accordance with claim 1,
   wherein said step (g) comprises the step of bonding a composite sheet, which includes a conductive metal sheet and said electrical insulator layer laminated to one side of said conductive metal sheet, to the backside of said support such that said electrical insulator layer faces said support.

* * * * *